US012648266B2

(12) United States Patent
Sung et al.

(10) Patent No.: US 12,648,266 B2
(45) Date of Patent: Jun. 2, 2026

(54) DISPLAY DEVICE AND METHOD OF MANUFACTURING THE SAME

(71) Applicant: SAMSUNG DISPLAY CO., LTD., Yongin-si (KR)

(72) Inventors: Woo Yong Sung, Yongin-si (KR); Jeongseok Lee, Suwon-si (KR); Seungyong Song, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 375 days.

(21) Appl. No.: 18/144,309

(22) Filed: May 8, 2023

(65) Prior Publication Data

US 2024/0047615 A1    Feb. 8, 2024

(30) Foreign Application Priority Data

Aug. 8, 2022    (KR) ......................... 10-2022-0098798

(51) Int. Cl.
H10H 20/831 (2025.01)
H10H 20/01 (2025.01)
H10H 20/857 (2025.01)

(52) U.S. Cl.
CPC ...... H10H 20/8312 (2025.01); H10H 20/857 (2025.01); *H10H 20/032* (2025.01); *H10H 20/0364* (2025.01)

(58) Field of Classification Search
CPC ............. H10H 20/8312; H10H 20/857; H10H 20/032; H10K 59/124; H10K 59/122; H10K 50/82; H10K 50/81
See application file for complete search history.

(56) References Cited

U.S. PATENT DOCUMENTS

| | | | | |
|---|---|---|---|---|
| 2022/0077251 A1* | 3/2022 | Choung | ........... | H10K 59/80522 |
| 2023/0112982 A1* | 4/2023 | Jin | ......................... | H10K 59/40 |
| | | | | 257/40 |
| 2023/0263014 A1* | 8/2023 | Lin | ...................... | H10K 59/122 |
| | | | | 257/40 |

FOREIGN PATENT DOCUMENTS

| | | |
|---|---|---|
| CN | 111312923 | 6/2020 |
| KR | 10-2000-0009715 A | 2/2000 |
| KR | 10-0337493 | 5/2002 |
| KR | 10-2008-0113782 | 12/2008 |
| KR | 10-2017-0102145 | 9/2017 |
| KR | 10-2017-0133812 | 12/2017 |
| KR | 10-2019-0107257 | 9/2019 |
| KR | 10-2020-0145954 | 12/2020 |
| KR | 10-2248402 | 4/2021 |
| KR | 10-2021-0053654 A | 5/2021 |
| KR | 10-2021-0086309 | 7/2021 |

OTHER PUBLICATIONS

Office Action dated Feb. 19, 2026 from the Korean Intellectual Property Office (KIPO) issued in corresponding Korean Patent Application No. 10-2022-0098798.

* cited by examiner

*Primary Examiner* — Christine A Enad
(74) *Attorney, Agent, or Firm* — F. CHAU & ASSOCIATES, LLC

(57)    ABSTRACT

A display device includes a substrate. A lower electrode is disposed on the substrate. A metal layer is disposed on the substrate and exposes at least a portion of the lower electrode. A light emitting layer is disposed on the lower electrode and the metal layer. An upper electrode is disposed on the light emitting layer. An insulating layer is disposed on the upper electrode.

9 Claims, 44 Drawing Sheets

SML4'
SML3'
SML2'
SML1'

IOL'
TL

SOP2

Figure 15:
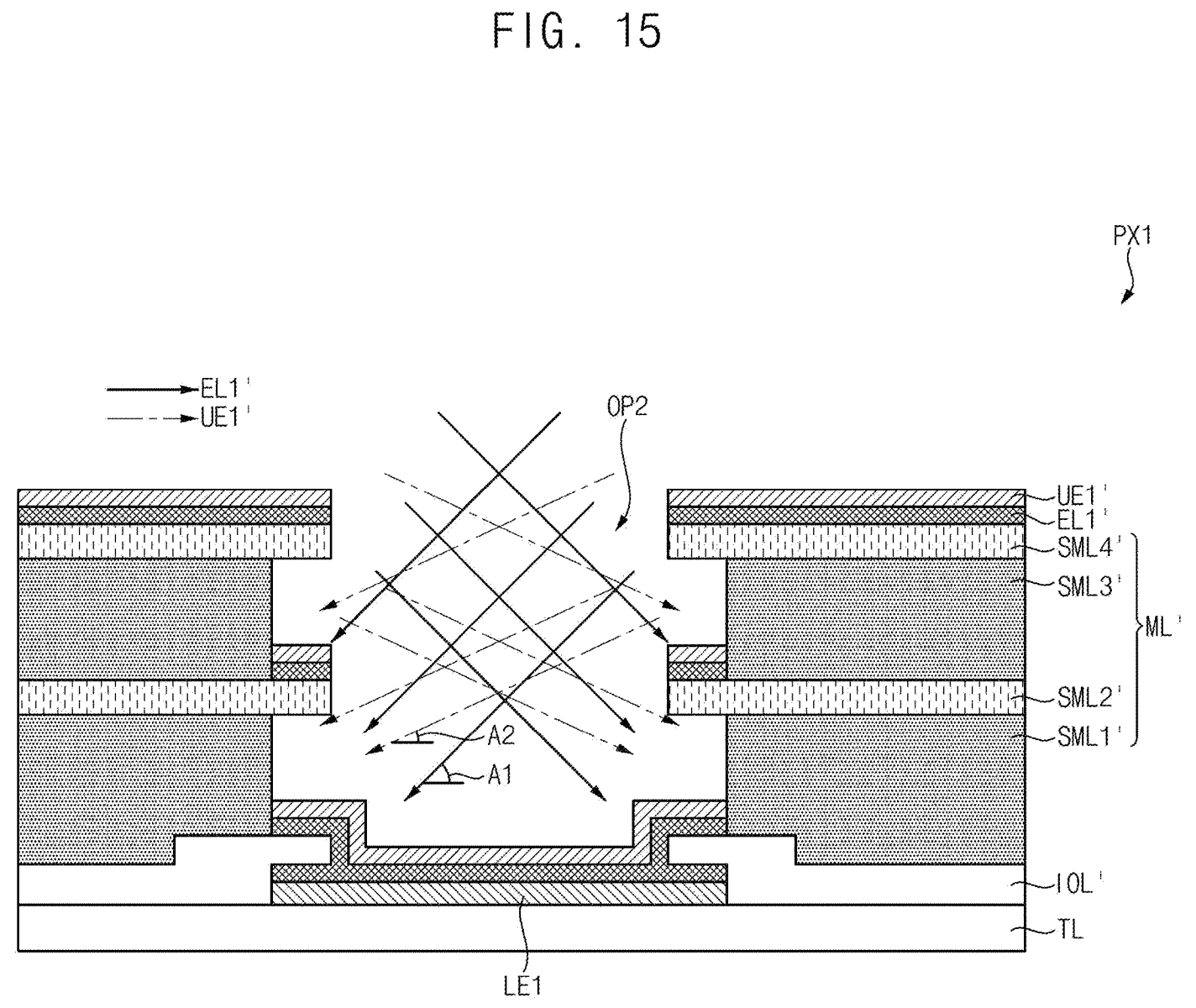

UE1'
EL1'
SML4'
SML3'
SML2'
SML1'
ML'

IOL'
TL

M1'
IL1'
UE1'
EL1'
SML4'
SML3'

ML'

SML2'
SML1'

IOL'

TL

SOP4

PR
M1'
IL1'
UE1'
EL1'
SML4'
SML3'
SML2'
SML1'
IOL'
TL

ML'

SOP4

M2'
IL2'
UE2'
EL2'
M1'
IL1'
UE1'
EL1'
SML4
SML3
SML2
SML1

ML

IOL
TL

DISPLAY DEVICE AND METHOD OF MANUFACTURING THE SAME

CROSS-REFERENCE TO RELATED APPLICATION(S)

This application claims priority under 35 USC § 119 to Korean Patent Application No. 10-2022-0098798, filed on Aug. 8, 2022 in the Korean Intellectual Property Office, the disclosure of which is incorporated by reference in its entirety herein.

TECHNICAL FIELD

Embodiments relate to a display device and a method of manufacturing the same.

DISCUSSION OF RELATED ART

A display device includes a light emitting layer. The light emitting layer may be formed using a mask, such as a fine metal mask. A dummy pixel that does not emit light may be formed between a non-display area and a display area of the display device to secure a process margin by the mask.

SUMMARY

Embodiments of the present disclosure provide a display device.

Embodiments of the present disclosure provide a method of manufacturing the display device.

According to an embodiment of the present disclosure, a display device includes a substrate. A lower electrode is disposed on the substrate. A metal layer is disposed on the substrate and exposes at least a portion of the lower electrode. A light emitting layer is disposed on the lower electrode and the metal layer. An upper electrode is disposed on the light emitting layer. An insulating layer is disposed on the upper electrode.

In an embodiment, the metal layer may include a first sub-metal layer. A second sub-metal layer is disposed on the first sub-metal layer. A third sub-metal layer is disposed on the second sub-metal layer. A fourth sub-metal layer is disposed on the third sub-metal layer.

In an embodiment, the second sub-metal layer and the fourth sub-metal layer may protrude from the first sub-metal layer and the third sub-metal layer in a direction parallel to an upper surface of the substrate.

In an embodiment, the first sub-metal layer and the third sub-metal layer may include aluminum. The second sub-metal layer and the fourth sub-metal layer may include titanium.

In an embodiment, the upper electrode may directly contact the first sub-metal layer and the third sub-metal layer.

In an embodiment, the metal layer may have a sub-opening exposing at least a portion of the second sub-metal layer.

In an embodiment, the sub-opening may have an undercut structure.

In an embodiment, the insulating layer may cover the light emitting layer, the upper electrode and the metal layer.

According to an embodiment of the present disclosure, a method of manufacturing a display device according to an embodiment of the present disclosure may include forming a first lower electrode and a second lower electrode on a substrate. A first sacrificial layer is formed on the first lower electrode and a second sacrificial layer is formed on the second lower electrode. A preliminary metal layer is formed on the first lower electrode and the second lower electrode. A first photoresist layer is formed on the preliminary metal layer. A first opening is formed by patterning the first photoresist layer. The first opening exposes the preliminary metal layer overlapping the first lower electrode. A second opening is formed that is connected to the first opening. The second opening exposes the first sacrificial layer and the preliminary metal layer. A wet etching is performed on the preliminary metal layer and the first sacrificial layer exposed by the second opening. The first photoresist layer is removed. A preliminary first light emitting layer is formed on the first lower electrode and the preliminary metal layer. A preliminary first upper electrode is formed on the preliminary first light emitting layer. A preliminary first insulating layer is formed on the preliminary first upper electrode.

In an embodiment, the preliminary first light emitting layer may be deposited at a first deposition angle, and the preliminary first upper electrode may be deposited at a second deposition angle.

In an embodiment, the first deposition angle may be greater than the second deposition angle.

In an embodiment, the forming of the preliminary metal layer may include forming a preliminary first sub-metal layer on the first lower electrode and the second lower electrode. A preliminary second sub-metal layer is formed on the preliminary first sub-metal layer. A preliminary third sub-metal layer is formed on the preliminary second sub-metal layer. A preliminary fourth sub-metal layer is formed on the preliminary third sub-metal layer.

In an embodiment, in the wet etching of the preliminary metal layer exposed by the second opening, the preliminary second sub-metal layer and the preliminary fourth sub-metal layer may protrude from the preliminary first sub-metal layer and the preliminary third sub-metal layer in a direction parallel to an upper surface of the substrate.

In an embodiment, the method may further include forming a second photoresist layer on the preliminary metal layer. A first sub-opening is formed by patterning the second photoresist layer. The first sub-opening exposes the preliminary fourth sub-metal layer positioned between the first lower electrode and the second lower electrode. A second sub-opening is formed that is connected to the first sub-opening. The second sub-opening exposes the preliminary second sub-metal layer.

In an embodiment, the second sub-opening may have an undercut structure.

In an embodiment, the method may further include forming a preliminary first protective layer on the preliminary first insulating layer.

In an embodiment, the method may further include forming a preliminary inorganic layer covering the first lower electrode and the second lower electrode on the substrate.

In an embodiment, the method may further include forming a second photoresist layer on the preliminary metal layer. A third opening is formed by patterning the second photoresist layer. The third opening exposes the preliminary first protective layer on the preliminary first insulating layer overlapping the second lower electrode. A fourth opening is formed that is connected to the third opening. The fourth opening exposes the second sacrificial and the preliminary metal layer. A wet etching is performed on the preliminary metal layer exposed by the fourth opening. The second photoresist layer is removed. A preliminary second light emitting layer is formed on the second lower electrode and the preliminary metal layer. A preliminary second upper electrode is formed on the preliminary second light emitting layer. A preliminary second insulating layer is formed on the preliminary second upper electrode.

In an embodiment, the method may further include removing the preliminary second upper electrode and the preliminary second light emitting layer overlapping the first lower electrode.

In an embodiment, the preliminary first light emitting layer may be formed without using a mask.

In a display device according to embodiments of the present disclosure, the display device may include a light emitting layer, an upper electrode disposed on the light emitting layer, and an insulating layer disposed on the upper electrode. In a method of manufacturing the display device, the light emitting layer, the upper electrode and the insulating layer may be formed without using a mask. Accordingly, the quality and productivity of the display device may be increased.

Also, dummy pixel and shadow formed by the mask may not be formed. Accordingly, the display area of the display device may be enlarged.

BRIEF DESCRIPTION OF THE DRAWINGS

FIGS. 4 to 42 are cross-sectional views illustrating a method of manufacturing the display device of FIG. 1 according to embodiments of the present disclosure.

FIG. 44 is a cross-sectional view illustrating a display device according to an embodiment of the present disclosure.

DETAILED DESCRIPTION OF EMBODIMENTS

Figure 1:
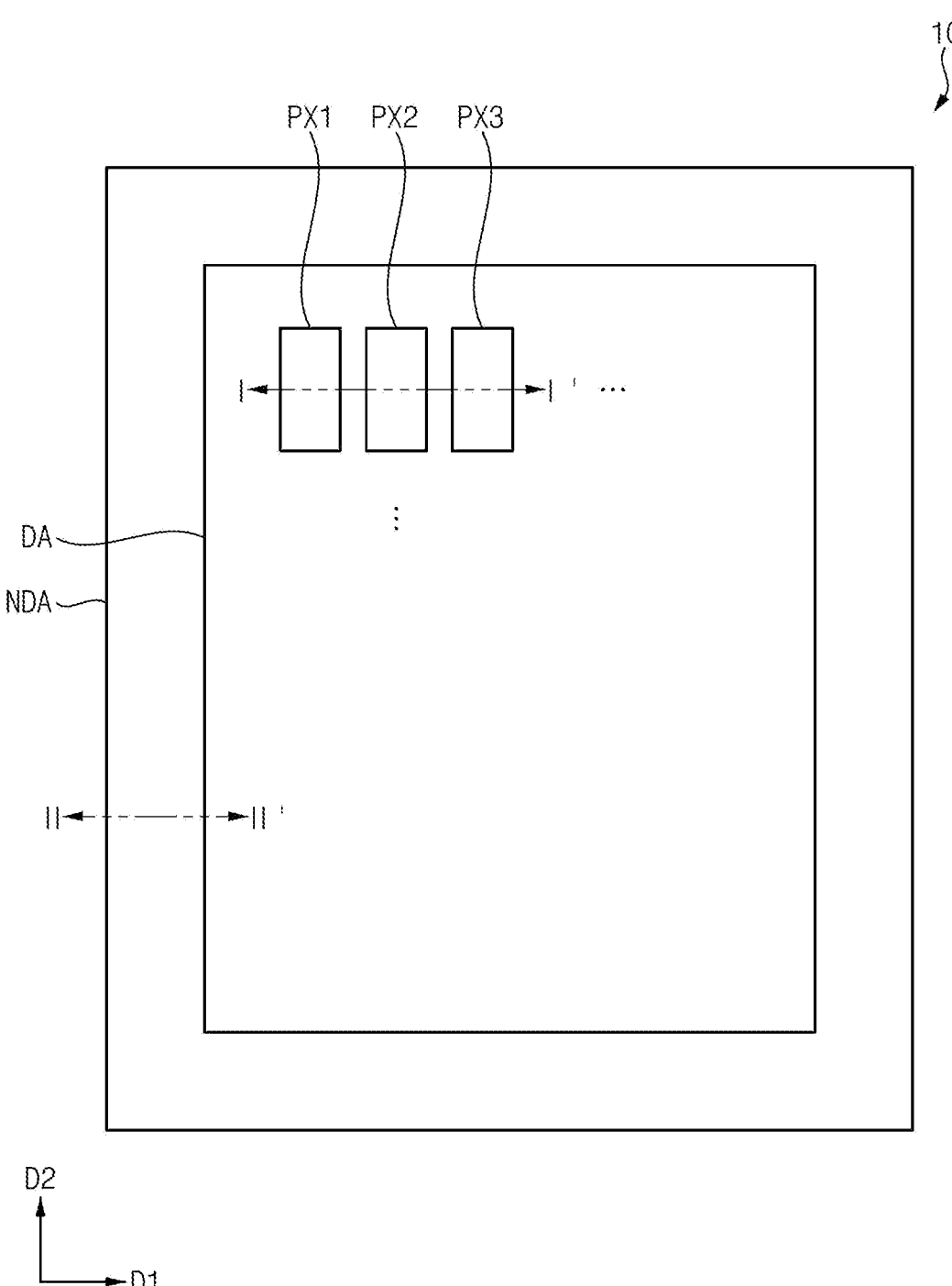
FIG. 1 is a plan view illustrating a display device according to an embodiment of the present disclosure.

Hereinafter, embodiments of the present disclosure will be described in more detail with reference to the accompanying drawings. The same reference numerals are used for the same components in the drawings, and redundant descriptions of the same components will be omitted.

FIG. 1 is a plan view illustrating a display device according to an embodiment.

Referring to FIG. 1, a display device 10 according to an embodiment may include a display area DA and a non-display area NDA. The display area DA may be an area capable of displaying an image by generating light. The non-display area NDA may be an area that does not display an image. In an embodiment, the non-display area NDA may surround at least a portion of the display area DA (e.g., in the first and second directions D1, D2). For example, the non-display area NDA may entirely surround the display area DA.

A plurality of pixels emitting light may be disposed in the display area DA, and accordingly, an image may be displayed in the display area DA. In an embodiment, the plurality of pixels may be arranged in a matrix extending along a first direction D1 and a second direction D2 crossing the first direction D1. For example, in an embodiment the second direction D2 may be orthogonal to the first direction D1. However, embodiments of the present disclosure are not necessarily limited thereto. Although FIG. 1 shows only first, second and third pixels PX1, PX2 and PX3 disposed in a part of the display area DA for convenience of explanation, embodiments of the present disclosure are not necessarily limited thereto and the number of pixels may vary.

The first, second and third pixels PX1, PX2 and PX3 may emit light of different or substantially the same color. For example, in an embodiment the first pixel PX1 may emit red it, the second pixel PX2 may emit blue light, and the third pixel PX3 may emit green light. However, embodiments of the present disclosure are not necessarily limited thereto, and the color of light emitted from the first, second and third pixels PX1, PX2 and PX3 may be variously changed.

Figure 2:
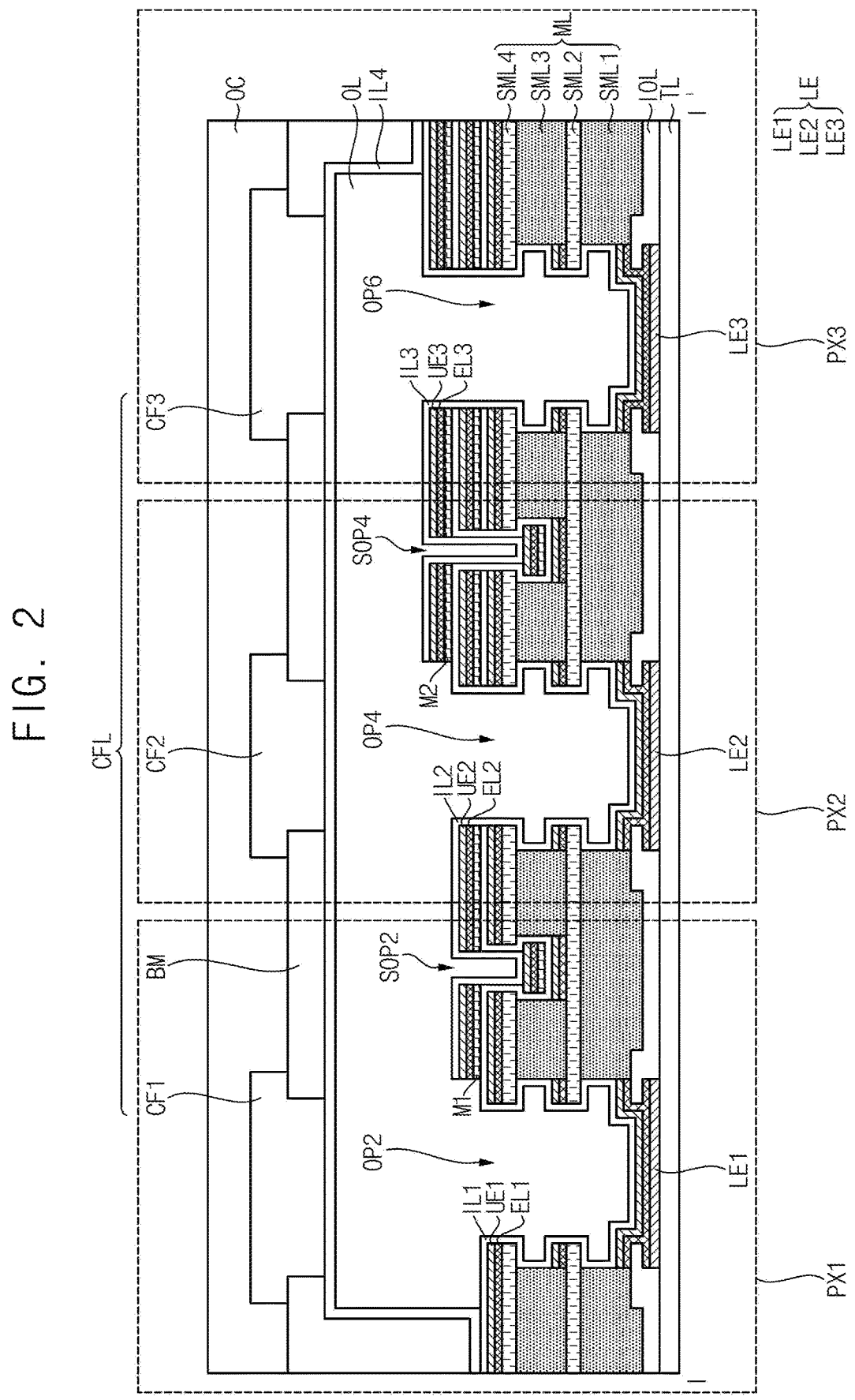
FIG. 2 is a cross-sectional view taken along line I-I' of FIG. 1 according to an embodiment of the present disclosure.
Figure 3:
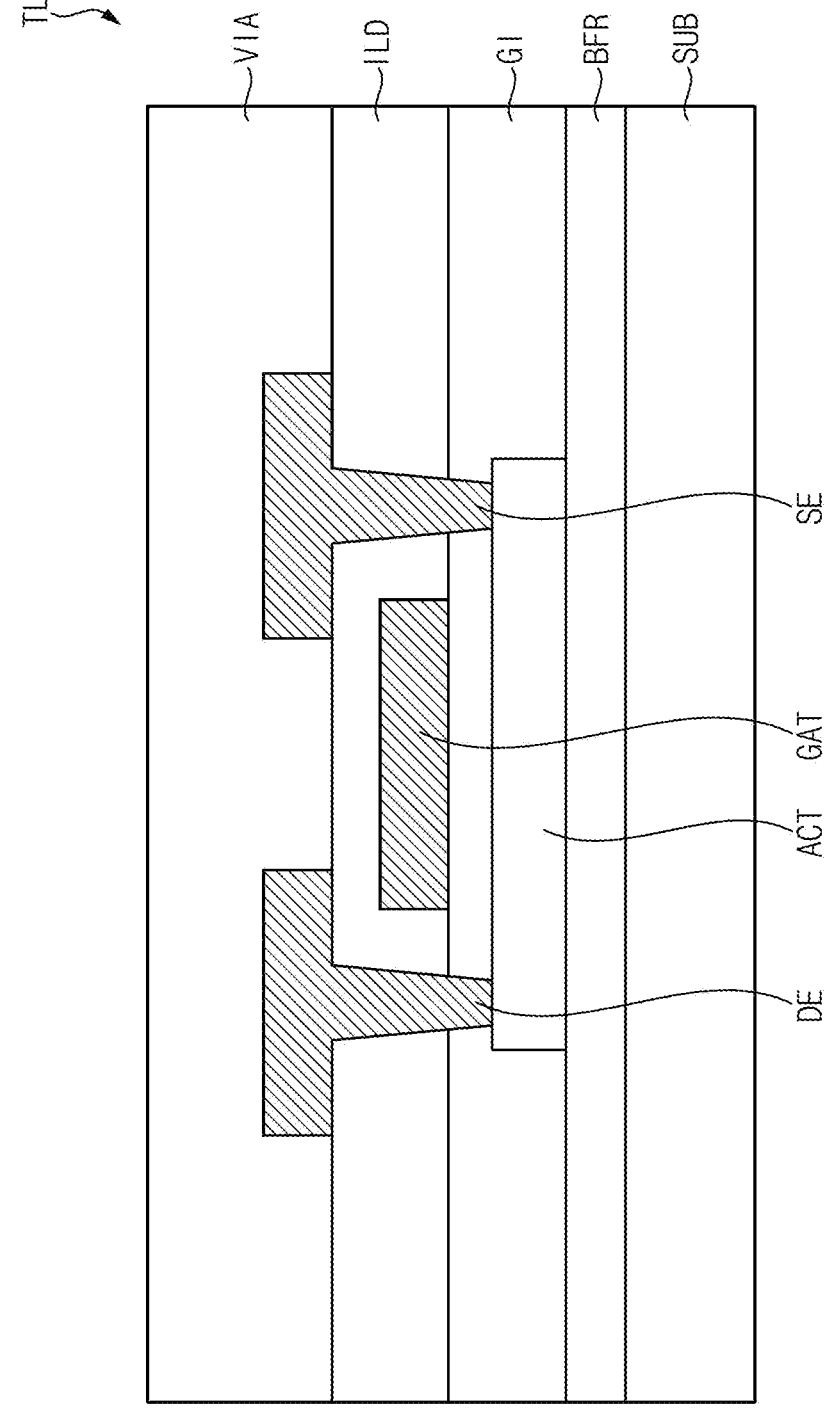
FIG. 3 is a cross-sectional view illustrating a transistor layer included in the display device of FIG. 2 according to an embodiment of the present disclosure.

FIG. 2 is a cross-sectional view taken along line I-I' of FIG. 1. FIG. 3 is a cross-sectional view illustrating a transistor layer included in the display device of FIG. 2. For example, FIGS. 2 and 3 are cross-sectional views illustrating an example of the display area DA of the display device 10 of FIG. 1.

Referring to FIG. 2, the display device 10 may include a transistor layer TL, a lower electrode LE, an inorganic layer IOL, a metal layer ML, a first light emitting layer EL1, a first upper electrode UE1, a first insulating layer IL1, a first protective layer M1, a second light emitting layer EL2, a second upper electrode UE2, a second insulating layer IL2, a second protective layer M2, a third light emitting layer EL3, a third upper electrode UE3, a third insulating layer IL3, an organic insulating layer OL, a fourth insulating layer IL4, a color filter layer CFL and an overcoating layer OC.

Referring to FIG. 3, the transistor layer TL may include a substrate SUB, a buffer layer BFR, an active pattern ACT, a gate insulating layer GI, a gate electrode GAT, an interlayer insulating layer ILD, a source electrode SE, a drain electrode DE and a via insulating layer VIA.

In an embodiment, the substrate SUB may be a transparent insulating substrate including glass, quartz, plastic, or the like. In an embodiment, the substrate SUB may include a first plastic layer, a first barrier layer disposed on the first plastic layer, a second plastic layer disposed on the first barrier layer and a second barrier layer disposed on the second plastic layer. In an embodiment, the first plastic layer and the second plastic layer may include an organic insulating material such as polyimide (PI) or the like. The first barrier layer and the second barrier layer may include an inorganic insulating material such as silicon oxide, silicon nitride, amorphous silicon, or the like. For example, the first barrier layer may have a multilayer structure including an amorphous silicon layer and a silicon oxide layer disposed on the amorphous silicon layer, and the second barrier layer may have a single layer structure including a silicon oxide layer.

The buffer layer HER may be disposed on the substrate SUB. In an embodiment, the buffer layer BFR may be formed of an inorganic material. Examples of materials that can be used as the inorganic material may include silicon oxide, silicon nitride, silicon oxynitride, or the like. These may be used alone or in combination with each other. The buffer layer BFR may prevent metal atoms or impurities from penetrating into the active pattern ACT. Also, the buffer layer BFR may control a heat supply rate during a crystallization process for forming the active pattern ACT.

The active pattern ACT may be disposed on (e.g., disposed directly thereon) the buffer layer BFR. In an embodiment, the active pattern ACT may be formed of a silicon semiconductor material or an oxide semiconductor material. Examples of the silicon semiconductor material that can be used as the active pattern ACT may include amorphous silicon, polycrystalline silicon, or the like. Examples of the oxide semiconductor material that may be used as the active pattern ACT may include indium gallium zinc oxide (IGZO), indium tin zinc oxide (ITZO), or the like. In addition, the oxide semiconductor material may further include indium (In), gallium (Ga), tin (Sn), zirconium (Zr), vanadium (V), hafnium (Hf), cadmium (Cd), germanium (Ge), chromium (Cr)), titanium (Ti) and zinc (Zn). These materials may be used alone or in combination with each other. The active pattern ACT may have a source region, a drain region and a channel region positioned between the source region and the drain region.

The gate insulating layer GI may be disposed on (e.g., disposed directly thereon) the buffer layer BFR and may cover the active pattern ACT. For example, the buffer layer BFR may cover lateral sides and a top surface of the active pattern ACT. In an embodiment, the gate insulating layer GI may be formed of an insulating material. Examples of the insulating material that can be used as the gate insulating layer GI may include silicon oxide, silicon nitride, silicon oxynitride, or the like. These materials may be used alone or in combination with each other.

The gate electrode GAT may be disposed on (e.g., disposed directly thereon) the gate insulating layer GI. The gate electrode GAT may overlap the channel region of the active pattern ACT (e.g., in a thickness direction of the substrate SUB). In an embodiment, the gate electrode GAT may be formed of metal, alloy, conductive metal oxide, transparent conductive material, or the like. Examples of materials that can be used as the gate electrode GAT may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These materials may be used alone or in combination with each other.

The interlayer insulating layer ILD may be disposed on (e.g., disposed directly thereon) the gate insulating layer GI and may cover the gate electrode GAT. For example, the gate insulating layer GI may cover lateral side surfaces and a top surface of the gate electrode GAT. In an embodiment, the interlayer insulating layer ILD may be formed of an insulating material. Examples of insulating material that can be used as the interlayer insulating layer ILD may include silicon oxide, silicon nitride, silicon oxynitride, or the like. These materials may be used alone or in combination with each other.

The source electrode SE and the drain electrode DE may be disposed on (e.g., disposed directly thereon) the interlayer insulating layer ILD. The source electrode SE may be connected to the source region of the active pattern ACT through a contact hole formed by removing a first portion of the gate insulating layer GI and the interlayer insulating layer ILD. The drain electrode DE may be connected to the drain region of the active pattern ACT through a contact hole formed by removing a second portion of the gate insulating layer GI and the interlayer insulating layer ILD. In an embodiment, the source electrode SE and the drain electrode DE may be formed of a metal, an alloy, a conductive metal oxide, a transparent conductive material, or the like. These materials may be used alone or in combination with each other.

The via insulating layer VIA may be disposed on (e.g., disposed directly thereon) the interlayer insulating layer ILD and may cover the source electrode SE and the drain electrode DE. For example, the via insulating layer VIA may cover lateral side surfaces and a top surface of the source and drain electrodes SE, DE. In an embodiment, the via insulation layer VIA may be formed of an organic material. Examples of the organic material may include photoresist, polyacrylic resin, polyimide resin, acrylic resin, or the like. These materials may be used alone or in combination with each other. Accordingly, the via insulation layer VIA may have a substantially flat upper surface.

Referring back to FIG. 2, the lower electrode LE may be disposed on the substrate SUB. For example, the lower electrode may be disposed on (e.g., disposed directly thereon) the via insulating layer VIA of the transistor layer TL. In an embodiment, the lower electrode LE may include a first lower electrode LE1, a second lower electrode LE2 and a third lower electrode LE3. However, embodiments of the present disclosure are not necessarily limited thereto and the number of electrodes in the lower electrode LE may vary. The lower electrode LE may be connected to the drain electrode DE through a contact hole formed by removing a portion of the via insulating layer VIA. In an embodiment, the lower electrode LE may be formed of a metal, an alloy, a metal oxide, a transparent conductive material, or the like. Examples of materials that can be used as the lower electrode LE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These materials may be used alone or in combination with each other. For example, in an embodiment the lower electrode LE may be an anode electrode.

The inorganic layer IOL may be disposed on (e.g., disposed directly thereon) the via insulating layer VIA. In an embodiment, the inorganic layer IOL may include a second opening OP2 exposing at least a portion of the first lower electrode LE1, a fourth opening OP4 exposing at least a portion of the second lower electrode LE2 and a sixth opening OP6 exposing at least a portion of the third lower electrode LE3. For example, in an embodiment each of the second opening OP2, the fourth opening OP4 and the sixth opening OP6 may have an undercut structure.

The metal layer ML may be disposed on the substrate SUB. The metal layer ML may include the second opening OP2, the fourth opening OP4 and the sixth opening OP6 exposing at least a portion of the first to third lower electrodes LE1, LE2, LE3, respectively. For example, the metal layer ML may be disposed (e.g., disposed directly thereon) the inorganic layer IOL. In an embodiment, the metal layer ML may include a first sub-metal layer SML1 disposed on the inorganic layer IOL, a second sub-metal layer SML2 disposed on the first sub-metal layer SML1, a third sub-metal layer SML3 disposed on the second sub-metal layer SML2 and a fourth sub-metal layer SML4 disposed on the third sub-metal layer SML3. However, embodiments of the present disclosure are not necessarily limited thereto and the number of the sub-metal layers may vary. For example, the second sub-metal layer SML2 and the fourth sub-metal layer SML4 may protrude from the first sub-metal layer SML1 and the third sub-metal layer SML3 in a direction parallel to an upper surface of the substrate SUB. In addition, in an embodiment the first sub-metal layer SML1 and the third sub-metal layer SML3 may include aluminum (Al), and the second sub-metal layer SML2 and the fourth sub-metal layer SML4 may include titanium (Ti).

In an embodiment, the metal layer ML may have a second sub-opening SOP2, and the second sub-opening SOP2 may expose at least a portion of the second sub-metal layer SML2 between the first lower electrode LE1 and the second lower electrode LE2. For example, in an embodiment the second sub-opening SOP2 may have an undercut structure. The undercut structure of the second sub-opening SOP2 may increase the adhesiveness of the first insulating layer IL1 to reduce the peeling phenomenon.

In an embodiment, the metal layer ML may have a fourth sub-opening SOP4, and the fourth sub-opening SOP4 may expose at least a portion of the second sub-metal layer SML2 between the second lower electrode LE2 and the third lower electrode LE3. For example, in an embodiment the fourth sub-opening SOP4 may have an undercut structure. The undercut structure of the fourth sub-opening SOP4 may increase the adhesiveness of the second insulating layer IL2 to reduce the peeling phenomenon.

The first light emitting layer EL1 may be disposed on the first lower electrode LE1 and the metal layer ML. For example, in an embodiment, the first light emitting layer EL1 may directly contact an entirety of the upper surface of the first lower electrode LE1, a portion of the inorganic layer IOL that protrudes from the second opening OP2, an upper surface of the second sub-metal layer SML2 that protrudes from the second opening OP2, an upper surface of the second sub-metal layer SML2 in the second sub-opening SOP2 and an upper surface of the fourth sub-metal layer SML4. The first light emitting layer EL1 may include an organic material emitting light of a predetermined color. For example, in an embodiment, the first light emitting layer EL1 may generate red light. However, embodiments of the present disclosure are not necessarily limited thereto and the color emitted by the first light emitting layer EL1 may vary. The first light emitting layer EL1 may emit light based on a potential difference between the first lower electrode LE1 and the first upper electrode UE1.

The first upper electrode UE1 may be disposed on (e.g., disposed directly thereon) the first light emitting layer EL1. In an embodiment, the first upper electrode UE1 may directly contact the first sub-metal layer SML1 and the third sub-metal layer SML3. For example, in an embodiment the first upper electrode UE1 may include a metal, an alloy, a metal nitride, a conductive metal oxide, a transparent conductive material, or the like. These materials may be used alone or in combination with each other.

The first insulating layer IL1 may be disposed on (e.g., disposed directly thereon) the first upper electrode UE1. In an embodiment, the first insulating layer IL1 may cover the first light emitting layer EL1, the first upper electrode UE1 and the metal layer ML. The first insulating layer IL1 may be formed of an inorganic material. For example, in an embodiment the inorganic material may include silicon oxide, silicon nitride, silicon oxynitride, or the like. These materials may be used alone or in combination with each other.

The first protective layer may be disposed on (e.g., disposed directly thereon) the first insulating layer IL1. In an embodiment, the first protective layer M1 may include indium gallium zinc oxide (IGZO), indium zinc oxide (IZO), or the like. For example, the first protective layer M1 may protect the first insulating layer IL1 from being etched by a dry etching method.

The second light emitting layer EL2 may be entirely disposed on the second lower electrode LE2, the metal layer ML and the first protective layer M1. For example, in an embodiment, the second light emitting layer EL2 may directly contact an entirety of the upper surface of the second lower electrode LE2, a portion of the inorganic layer IOL that protrudes from the fourth opening OP4, an upper surface of the second sub-metal layer SML2 that protrudes from the fourth opening OP4 and an upper surface of the second sub-metal layer SML2 in the fourth sub-opening SOP4. The second light emitting layer EL2 may include an organic material emitting light of a predetermined color. For example, in an embodiment the second light emitting layer EL2 may generate blue light. However, embodiments of the present disclosure are not necessarily limited thereto and the color emitted by the second light emitting layer EL2 may vary. The second light emitting layer EL2 may emit light based on a potential difference between the second lower electrode LE2 and the second upper electrode UE2.

The second upper electrode UE2 may be disposed on (e.g., disposed directly thereon) the second light emitting layer EL2. In an embodiment, the second upper electrode UE2 may directly contact the first sub-metal layer SML1 and the third sub-metal layer SML3. For example, in an embodiment the second upper electrode UE2 may include a metal, an alloy, a metal nitride, a conductive metal oxide, a transparent conductive material, or the like. These materials may be used alone or in combination with each other.

The second insulating layer IL2 may be disposed on (e.g., disposed directly thereon) the second upper electrode UE2. In an embodiment, the second insulating layer IL2 may cover the second light emitting layer EL2, the second upper electrode UE2 and the metal layer ML. The second insulating layer IL2 may be formed of an inorganic material. For example, in an embodiment the inorganic material may include silicon oxide, silicon nitride, silicon oxynitride, or the like. These materials may be used alone or in combination with each other.

The second protective layer M2 may be disposed on (e.g., disposed directly thereon) the second insulating layer IL2. In an embodiment, the second protective layer M2 may include indium gallium zinc oxide (IGZO), indium zinc oxide (IZO), or the like. For example, the second protective layer M2 may protect the second insulating layer IL2 in a dry etching step.

The third light emitting layer EL3 may be disposed on the third lower electrode LE3, the metal layer ML and the second protective layer M1. For example, in an embodiment, the third light emitting layer EL3 may directly contact an entirety of the upper surface of the third lower electrode LE3, a portion of the inorganic layer IOL that protrudes from the sixth opening OP6, an upper surface of the second sub-metal layer SML2 that protrudes from the sixth opening OP6 and an upper surface of the second sub-metal layer SML2 in the sixth sub-opening SOP6. The third light emitting layer EL3 may include an organic material emitting light of a predetermined color. For example, in an embodiment the third light emitting layer EL3 may generate green light. However, embodiments of the present disclosure are not necessarily limited thereto and the color emitted by the third light emitting layer EL3 may vary. The third light emitting layer EL3 may emit light based on a potential difference between the third lower electrode LE3 and the third upper electrode UE3.

The third upper electrode UE3 may be disposed on (e.g., disposed directly thereon) the third light emitting layer EL3. In an embodiment, the third upper electrode UE3 may directly contact the first sub-metal layer SML1 and the third sub-metal layer SML3. For example, in an embodiment the third upper electrode UE3 may include a metal, an alloy, a metal nitride, a conductive metal oxide, a transparent conductive material, or the like. These materials may be used alone or in combination with each other.

The third insulating layer IL3 may be disposed on (e.g., disposed directly thereon) the third upper electrode UE3. In an embodiment, the third insulating layer IL3 may cover all of the third light emitting layer EL3, the third upper electrode UE3 and the metal layer ML. The third insulating layer IL3 may be formed of an inorganic material. For example, in an embodiment the inorganic material may include silicon oxide, silicon nitride, silicon oxynitride, or the like. These materials may be used alone or in combination with each other.

The organic insulating layer OL may be disposed on (e.g., disposed directly thereon) the first, second and third insulating layers IL1, IL2, and IL3. In an embodiment, the organic insulating layer OL may be formed of an organic material. Examples of the organic material may include photoresist, polyacrylic resin, polyimide resin, acrylic resin, or the like. These materials may be used alone or in combination with each other. Accordingly, the organic insulating layer OL may have a substantially flat upper surface.

The fourth insulating layer IL4 may be disposed on (e.g., disposed directly thereon) the organic insulating layer OL. In an embodiment, the fourth insulating layer IL4 may be formed of an inorganic material. Examples of the inorganic material may include silicon oxide, silicon nitride, silicon oxynitride, or the like. These materials may be used alone or in combination with each other.

In an embodiment, the first, second and third insulating layers IL1, IL2 and IL3, the organic insulating layer OL and the fourth insulating layer IL4 may constitute a thin film encapsulation layer. For example, the first insulating layer ILL the organic insulating layer OL, and the fourth insulating layer IL4 may constitute the thin film encapsulation layer of the first pixel PX1, the second insulating layer IL2, the organic insulating layer OL and the fourth insulating layer IL4 may constitute the thin film encapsulation layer of the second pixel PX2, and the third insulating layer IL3, the organic insulating layer OL and the fourth insulating layer IL4 may constitute the thin film encapsulation layer of the third pixel PX3. The thin film encapsulation layer may prevent penetration of moisture and/or oxygen into the first, second and third light emitting layers EL1, EL2 and EL3.

The color filter layer CFL may be disposed on (e.g., disposed directly thereon) the fourth insulating layer IL4. In an embodiment, the color filter layer CFL may include a light blocking part BM and first, second and third color filters CF1, CF2 and CF3. In an embodiment, each of the first, second and third color filters CF1, CF2 and CF3 may include a polymer photoresist and a pigment or dye. Each of the first, second and third color filters CF1, CF2 and CF3 may be disposed to correspond to each of the first pixel PX1, the second pixel PX2 and the third pixel PX3. For example, in an embodiment the first color filter CF1 may be a red color filter, the second color filter CF2 may be a blue color filter, and the third color filter CF3 may be a green color filter. However, embodiments of the present disclosure are not necessarily limited thereto.

In an embodiment, the light blocking part BM may be a black matrix. The light blocking part BM may include an organic light blocking material or an inorganic light blocking material including black pigment or black dye. For example, the light blocking part BM may prevent light leakage and prevent the light emitted from the first, second and third light emitting layers EL1, EL2 and EL3 emitting different colors from being mixed. Also, the light blocking part BM may distinguish boundaries between the adjacent first, second and third color filters CF1, CF2 and CF3.

The overcoating layer OC may be disposed on (e.g., disposed directly thereon) the color filter layer CFL. In an embodiment, the overcoating layer OC may be formed of an organic material. Examples of the organic material may include photoresist, polyacrylic resin, polyimide resin, acrylic resin, or the like. These materials may be used alone or in combination with each other. Accordingly, the overcoating layer DC may have a substantially flat upper surface.

Figure 35:
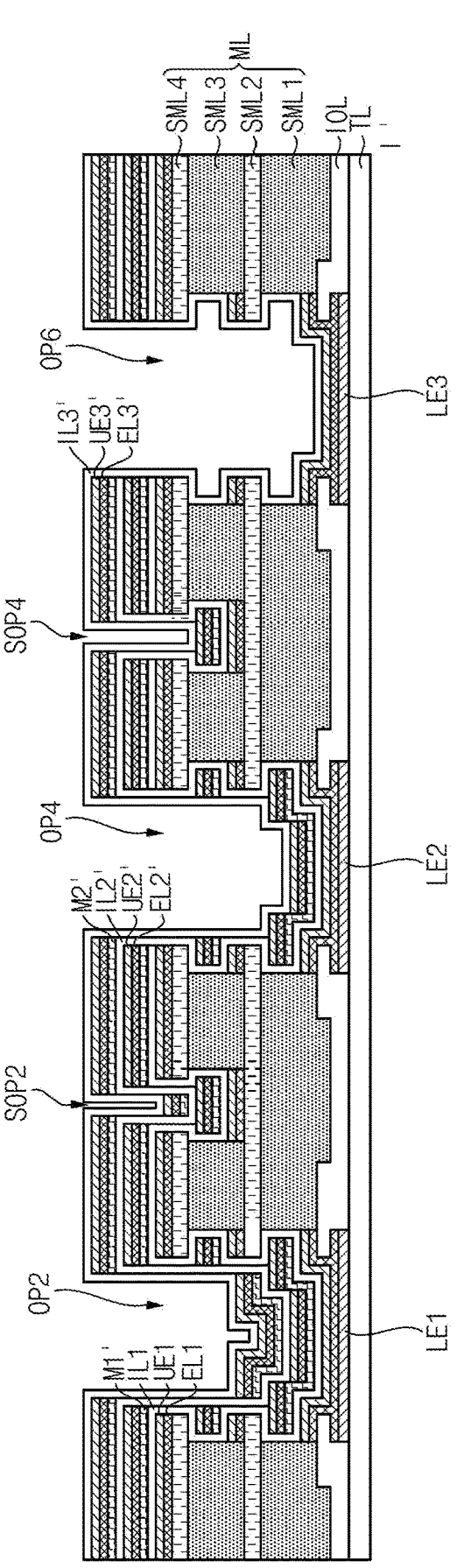

FIGS. 4 to 42 are cross-sectional views illustrating a method of manufacturing the display device of FIG. 1. For example, FIGS. 4 to 17 are enlarged cross-sectional views of the first pixel PX1 area, FIGS. 18 to 28 are enlarged cross-sectional views of the second pixel PX2 area, and FIGS. 29 to 34 are enlarged cross-sectional views of the third pixel PX3 area. Also, FIG. 15 is a cross-sectional view illustrating deposition angles of a preliminary first light emitting layer EL1' and a preliminary first upper electrode UE1', and FIG. 35 is a cross-sectional view illustrating areas of the first, second and third pixels PX1, PX2, and PX3 formed by the method of manufacturing illustrated with reference to FIGS. 4 to 34.

Figure 4:
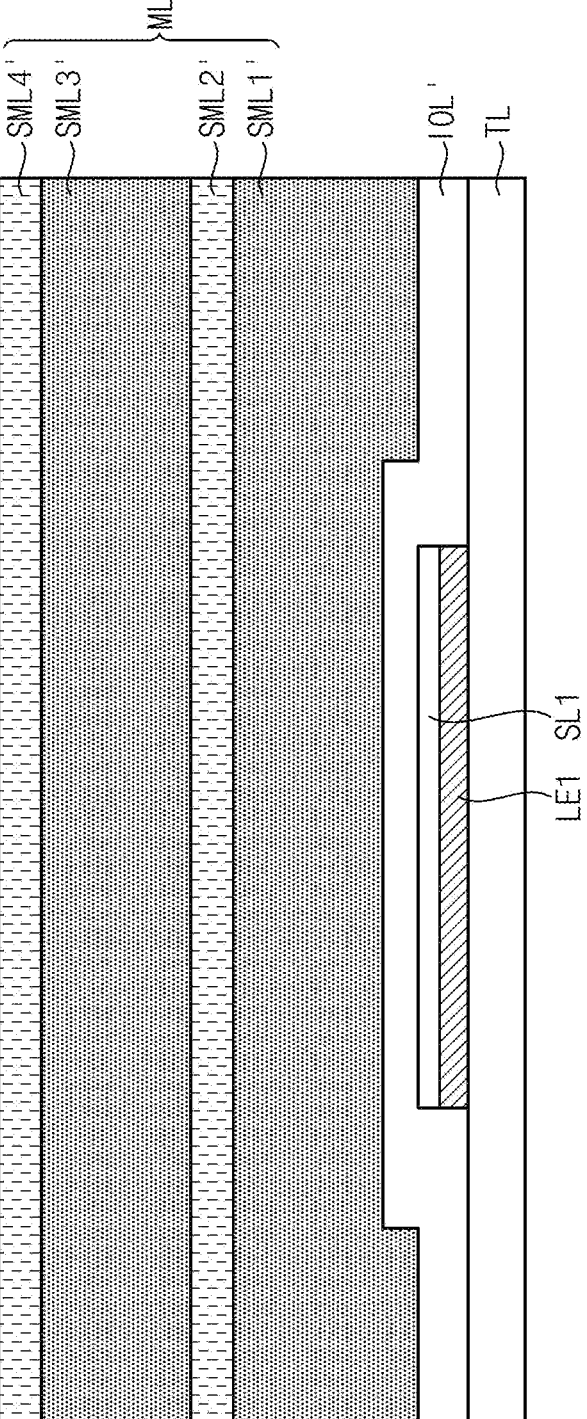

Referring to FIG. 4, the first lower electrode LE1 and a first sacrificial layer SL1 may be formed on the substrate SUB of the transistor layer TL. The first sacrificial layer SL1 may cover the entire upper surface of the first lower electrode LE1. In an embodiment, the first sacrificial layer SL1 may be formed using indium gallium zinc oxide (IGZO), indium zinc oxide (IZO), or the like.

A preliminary inorganic layer IOL' may be formed on (e.g., formed directly thereon) the transistor layer TL. The preliminary inorganic layer IOL' may be formed to cover the first lower electrode LE1 and the first sacrificial layer SL1. For example, the preliminary inorganic layer IOL' may directly contact an upper surface of the first sacrificial layer SL1 and lateral side surfaces of the first lower electrode LE1 and the first sacrificial layer SL1. In an embodiment, the preliminary inorganic layer IOL' may include silicon oxide, silicon nitride, or the like.

A preliminary metal layer ML' may be formed on the preliminary inorganic layer IOL'. In an embodiment, a preliminary first sub-metal layer SML1' may be formed on (e.g., formed directly thereon) the preliminary inorganic layer IOL', a preliminary second sub-metal layer SML2' may be formed on the preliminary first sub-metal layer SML1', a preliminary third sub-metal layer SML3' may be formed on the preliminary second sub-metal layer SML2', and a preliminary fourth sub-metal layer SML4' may be formed on the preliminary third sub-metal layer SML3'. However, embodiments of the present disclosure are not necessarily limited thereto and the number of the sub-metal layers may vary. In an embodiment, the preliminary first sub-metal layer SML1' and the preliminary third sub-metal layer SML3' may include aluminum (Al), and the preliminary second sub-metal layer SML2' and the preliminary fourth sub-metal layer SML4' may include titanium (Ti).

Figure 5:
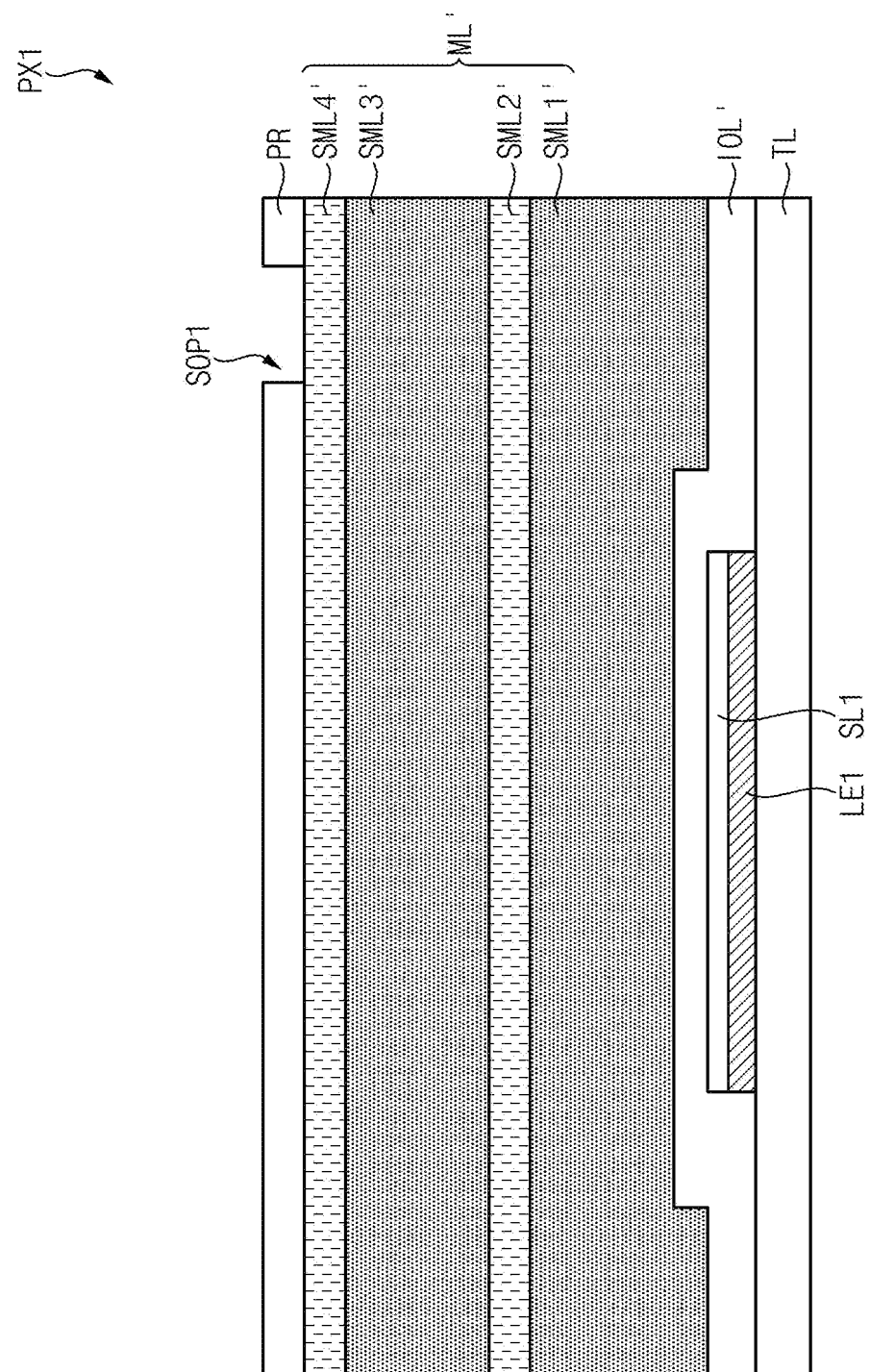

Referring to FIG. 5, a photoresist layer PR may be formed on the preliminary metal layer ML'. A first sub-opening SOP1 may be formed by patterning the photoresist layer PR, and the first sub-opening SOP1 may expose the preliminary fourth sub-metal layer SML4' between the first lower electrode LE1 and the second lower electrode LE2.

Figure 6:
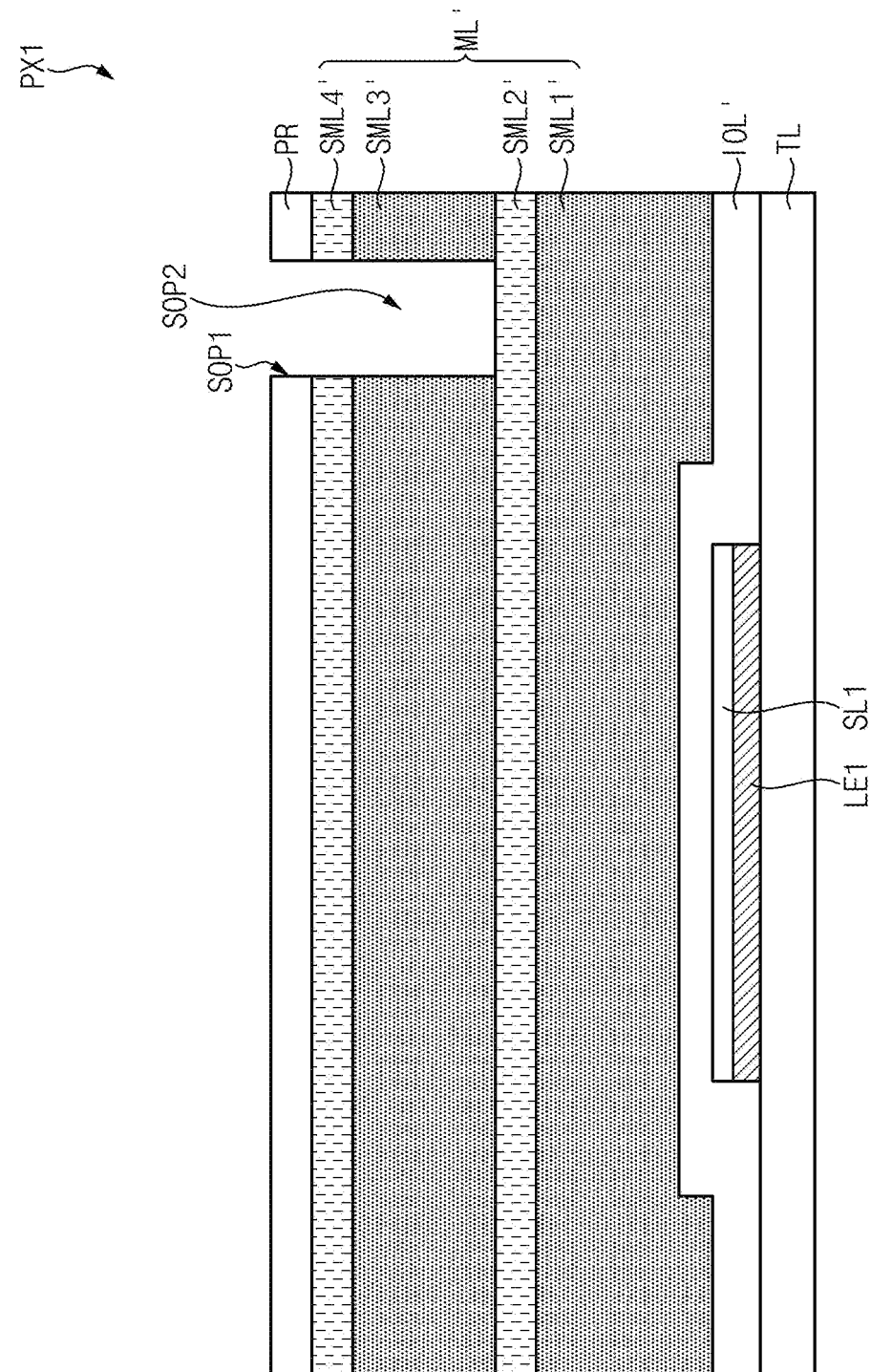

Referring to FIG. 6, a second sub-opening SOP2 connected to the first sub-opening SOP1 and exposing the preliminary second sub-metal layer SML2' may be formed. For example, in an embodiment the second sub-opening SOP2 may be formed by partially removing the preliminary third sub-metal layer SML3' and the preliminary fourth sub-metal layer SML4' by a dry etching method.

Figure 7:
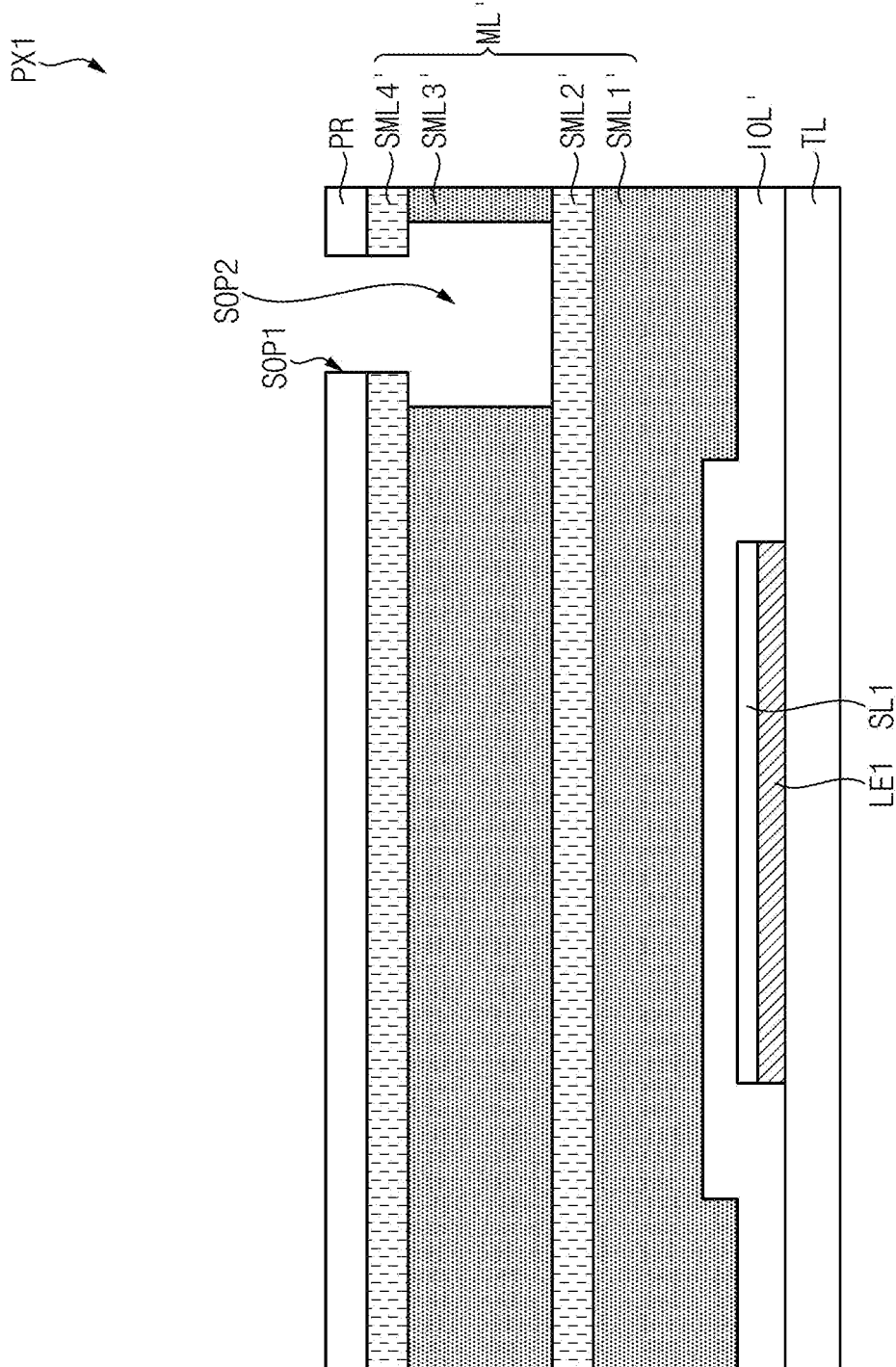

Referring to FIG. 7, the preliminary third sub-metal layer SML3' exposed by the second sub-opening SOP2 may be partially removed by a wet etching method. Accordingly, the second sub-opening SOP2 may have an undercut structure.

Figure 8:
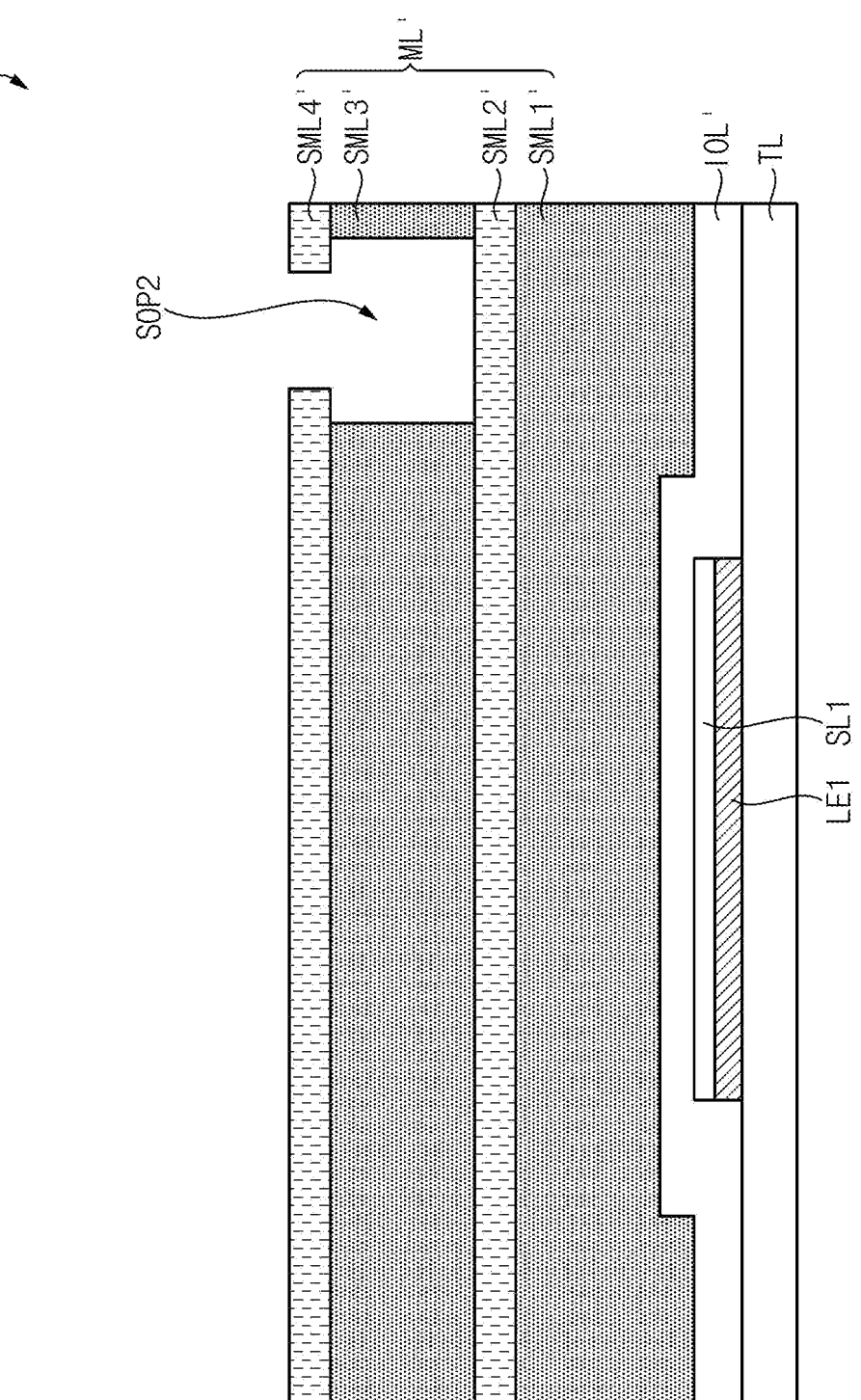

Referring to FIG. 8, the photoresist layer PR may be removed.

Figure 9:
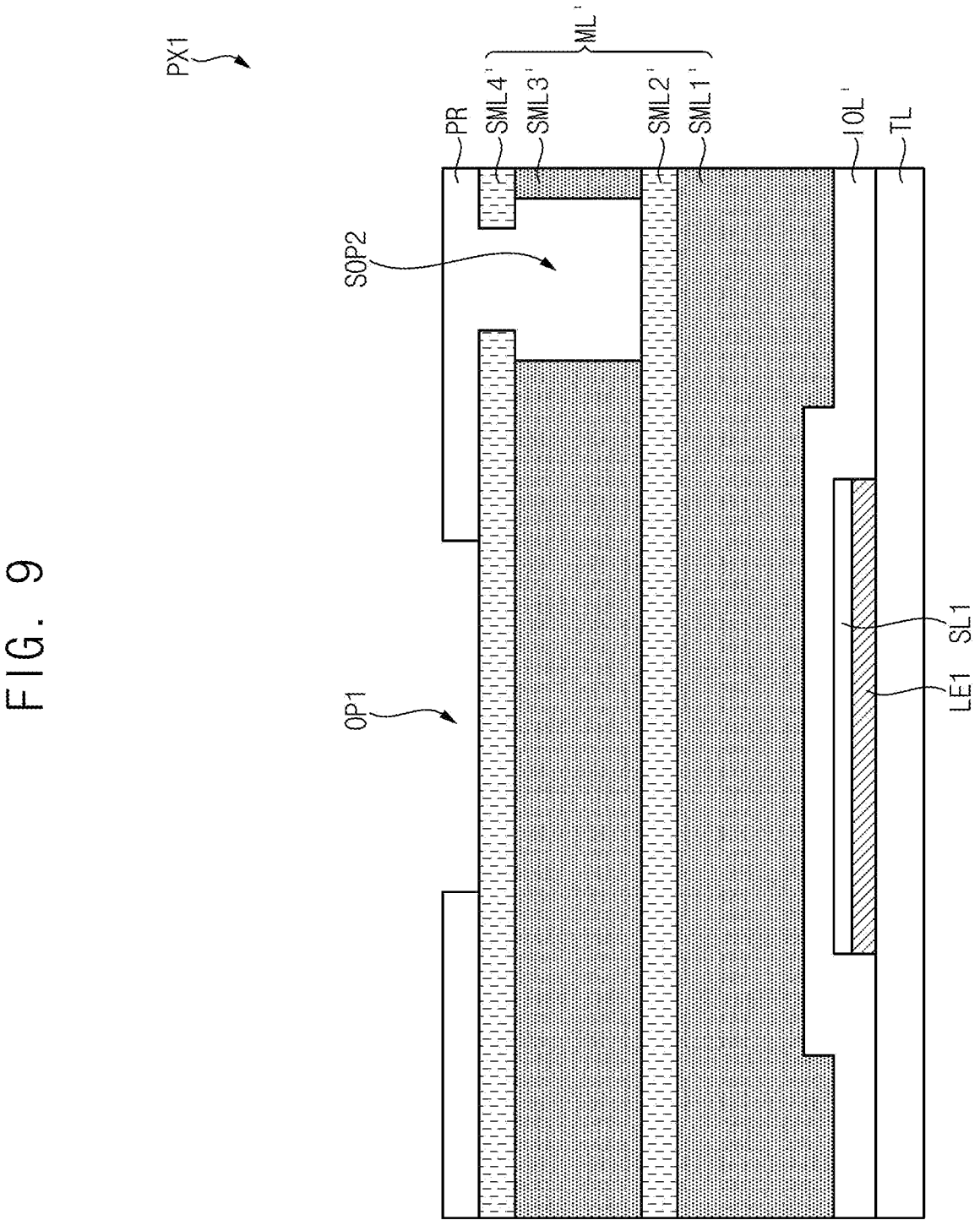

Referring to FIG. 9, a photoresist layer PR may be formed on the preliminary metal layer ML'. A first opening OP1 may be formed by patterning the photoresist layer PR. The first opening OP1 may expose the preliminary fourth sub-metal layer SML4' overlapping the first lower electrode LE1 (e.g., in a thickness direction of the substrate SUB).

Figure 10:
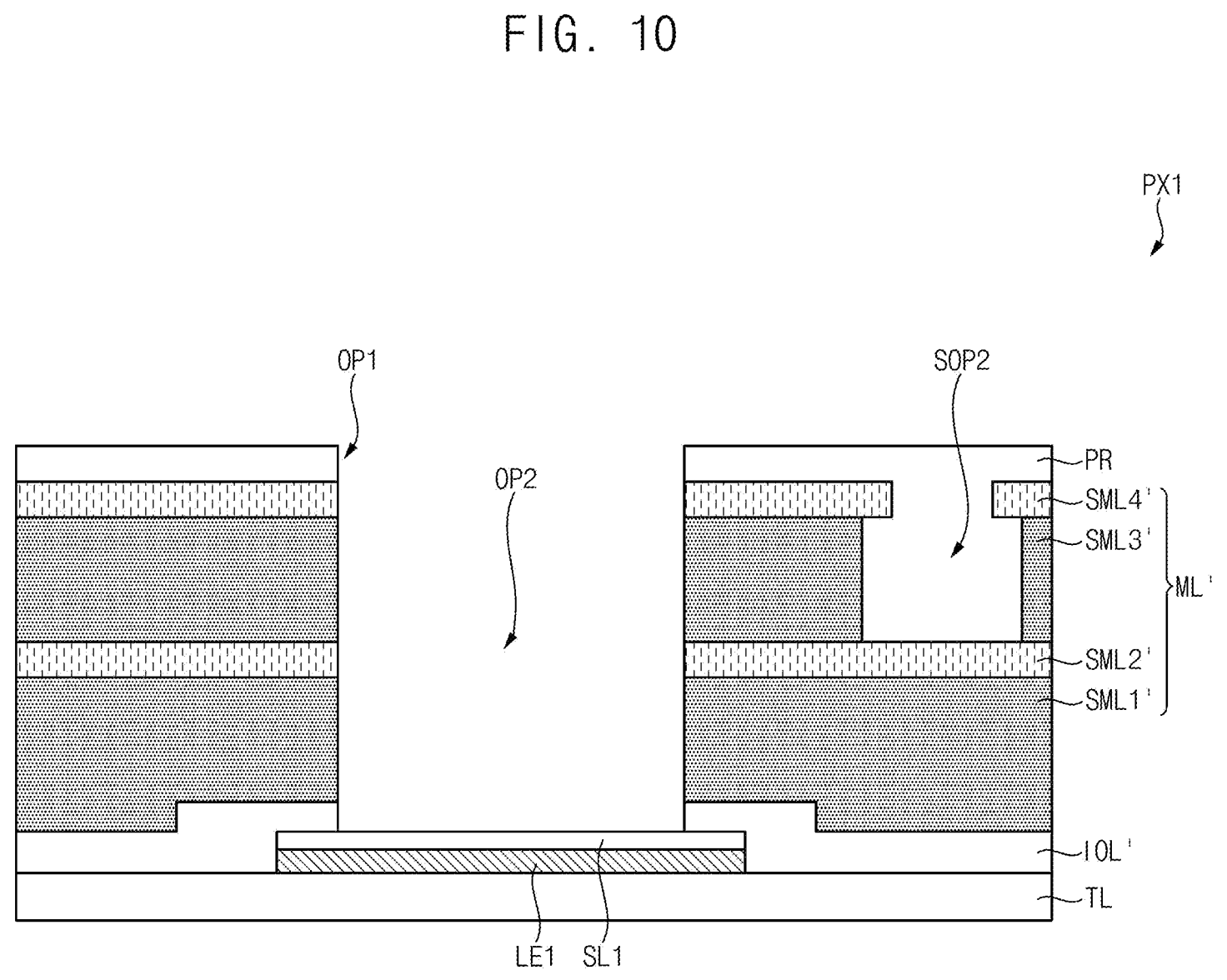

Referring to FIG. 10, a second opening OP2 connected to the first opening OP1 and exposing the first sacrificial layer SL1 may be formed. For example, in an embodiment the second opening OP2 may be formed by partially removing the preliminary inorganic layer IOL' and the preliminary metal layer ML' by a dry etching method. The second opening OP2 may expose a portion of the upper surface of the first sacrificial layer SL1 and lateral sides of the preliminary metal layer ML' defining the second opening OP2.

In this embodiment, since the first sacrificial layer SL1 covers the entire upper surface of the first lower electrode LE1, the first lower electrode LE1 may not be removed by the dry etching method. For example, the first sacrificial layer SL1 may protect the first lower electrode LE1 from being etched by the dry etching method.

Figure 11:
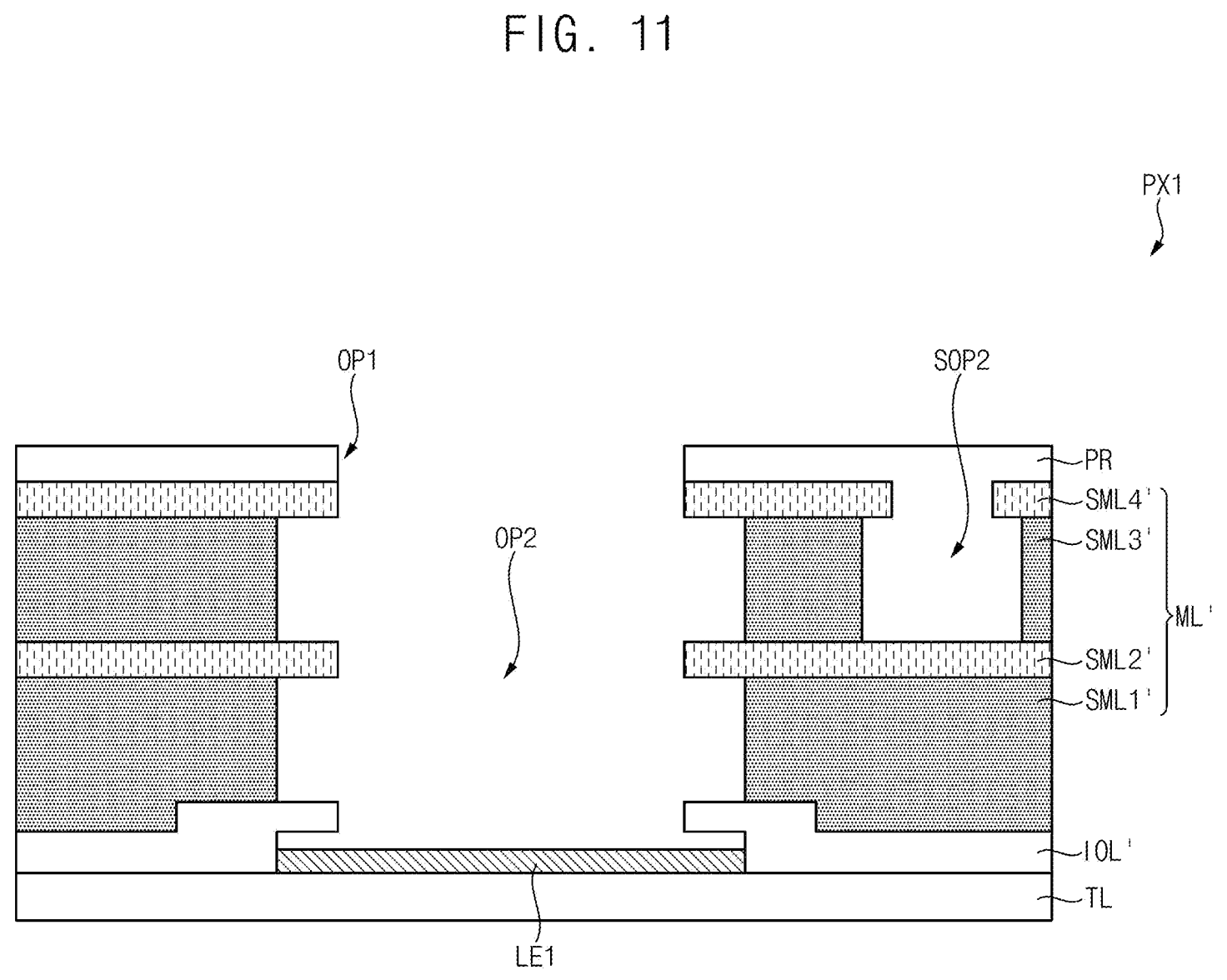

Referring to FIG. 11, in an embodiment the preliminary first sub-metal layer SML1' and the preliminary third sub-metal layer SML3' exposed by the second opening OP2 may be partially removed by a wet etching method. Accordingly, the preliminary second sub-metal layer SML2' and the preliminary fourth sub-metal layer SML4' may protrude from the preliminary first sub-metal layer SML1' and the preliminary third sub-metal layer SML3' (e.g., in a direction parallel to an upper surface of the substrate SUB).

The first sacrificial layer SL1 exposed by the second opening OP2 may be removed by the wet etching method. As the first sacrificial layer SL1 is removed, the second opening OP2 may have an undercut structure.

Figure 12:
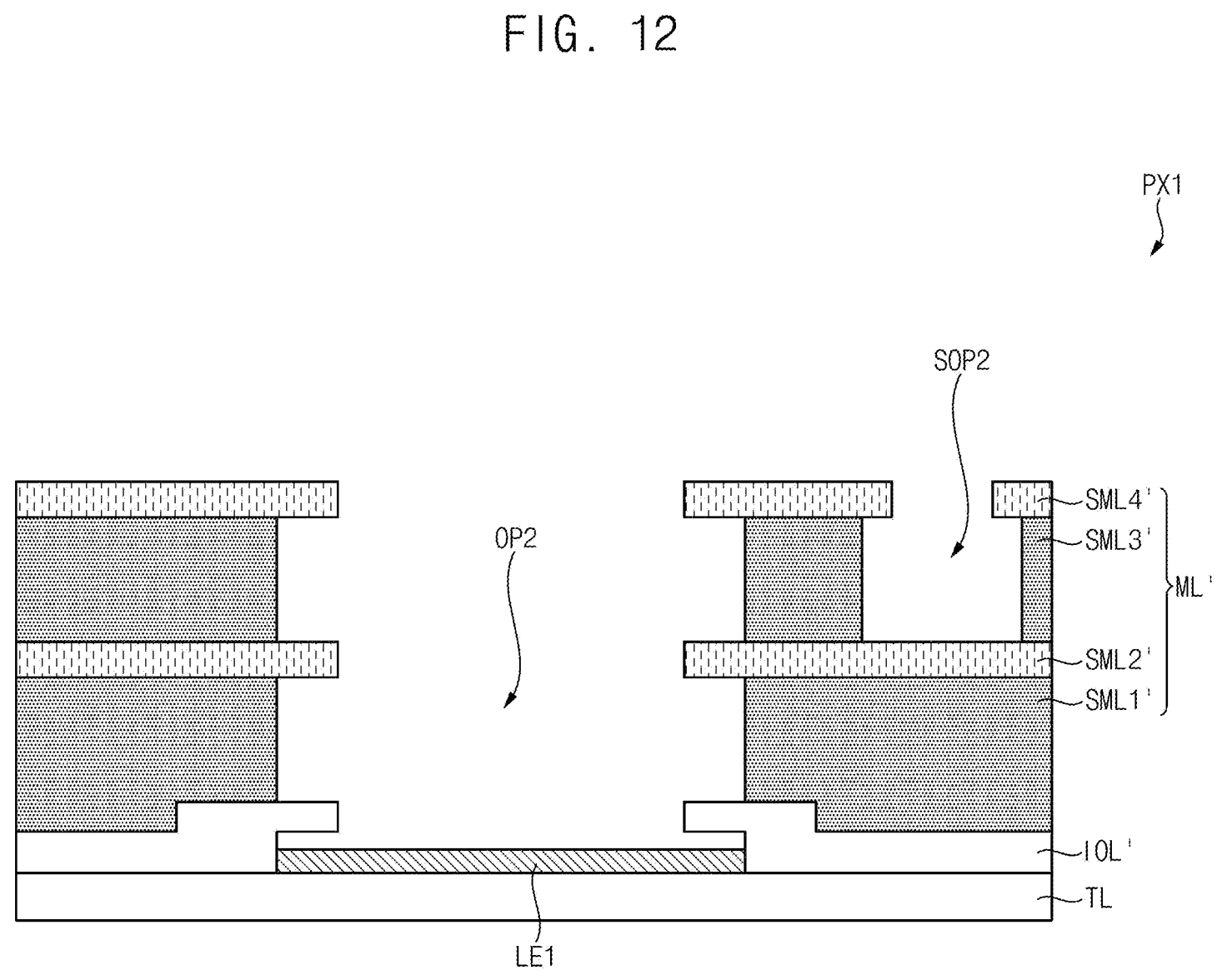

Referring to FIG. 12, the photoresist layer PR may be removed.

Figure 13:
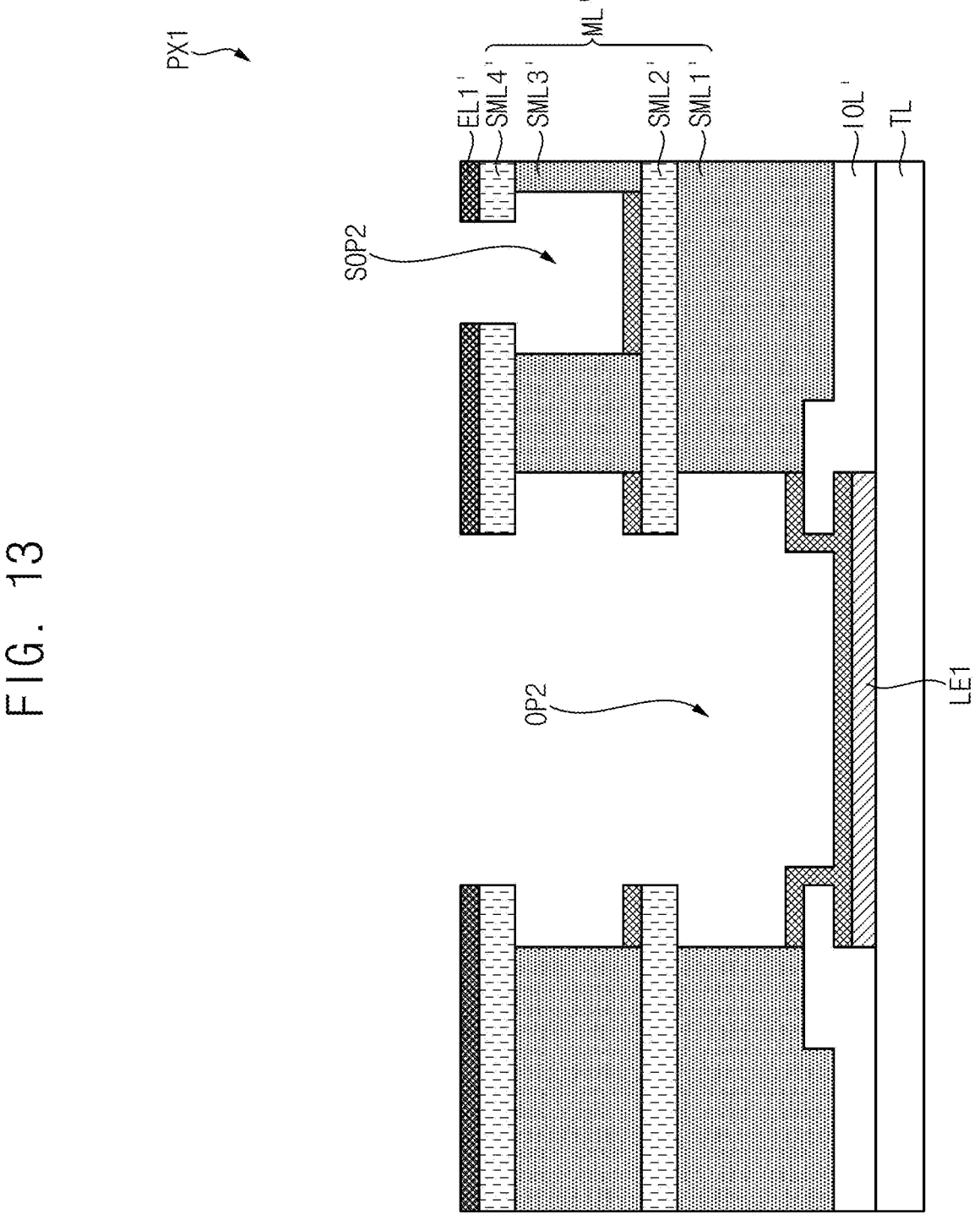

Referring to FIG. 13, a preliminary first light emitting layer EL1' may be formed on the first lower electrode LE1 and the preliminary metal layer ML'. For example, the preliminary first it emitting layer EL1' may be formed on (e.g., disposed directly thereon) an entirety of the upper surface of the first lower electrode LE1, a portion where the preliminary inorganic layer IOL' protrudes from the second opening OP2 an upper surface of the preliminary second sub-metal layer SML2' in a portion of the preliminary second sub-metal layer SML2' protruding from the second opening OP2, an upper surface of the preliminary second sub-metal layer SML2' in the second sub-opening SOP2, and an upper surface of the preliminary fourth sub-metal layer SML4'. For example, the preliminary first light emitting layer EL1' may fill a space of the undercut structure of the second opening OP2. In an embodiment, the preliminary first light emitting layer EL1' may include the same material as the first light emitting layer EL1.

In an embodiment, the preliminary first light emitting layer EL1' may be formed without using a mask. For example, a mask may include an open mask, a fine metal mask, or the like. As the preliminary first light emitting layer EL1' is formed without using the mask, the preliminary first light emitting layer EL1' may be formed in all regions of the display device 10.

Figure 14:
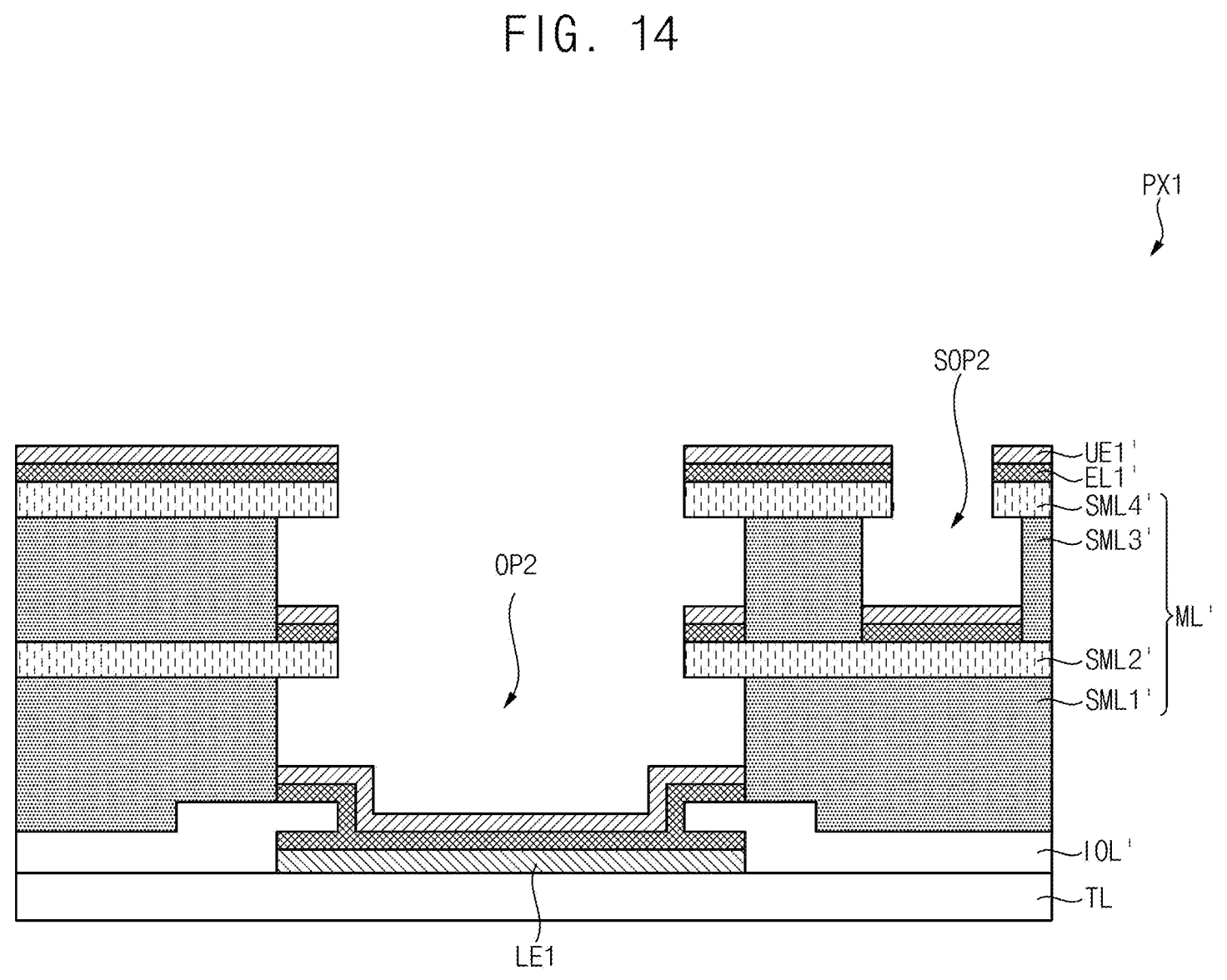

Referring to FIG. 14, a preliminary first upper electrode UE1' may be formed on (e.g., disposed directly thereon) the preliminary first light emitting layer EL1'. The preliminary first upper electrode UE1' may include the same material as the first upper electrode UE1. In an embodiment, the preliminary first upper electrode UE1' may be formed without using a mask. As the preliminary first upper electrode UE1' is formed without using the mask, the preliminary first upper electrode UE1' may be formed in all areas of the display device 10.

Referring to FIG. 15, the preliminary first light emitting layer EL1' may be deposited at a first deposition angle A1, and the preliminary first upper electrode UE1' may be deposited at a second deposition angle A2. In an embodiment, the first deposition angle A1 may be greater than the second deposition angle A2 with respect to a direction parallel to an upper surface of the substrate SUB of the transistor layer TL. For example, in an embodiment the first deposition angle A1 may be in a range of about 45° to about 50°, and the second deposition angle A2 may be less than about 30°. However, embodiments of the present disclosure are not necessarily limited thereto. Accordingly, the preliminary first upper electrode UE1' may directly contact the preliminary first sub-metal layer SML1' and the preliminary third sub-metal layer SML3'. For example, the portions of the preliminary first upper electrode UE1' on different levels from each other may be electrically connected through the preliminary metal layer ML'.

Figure 16:
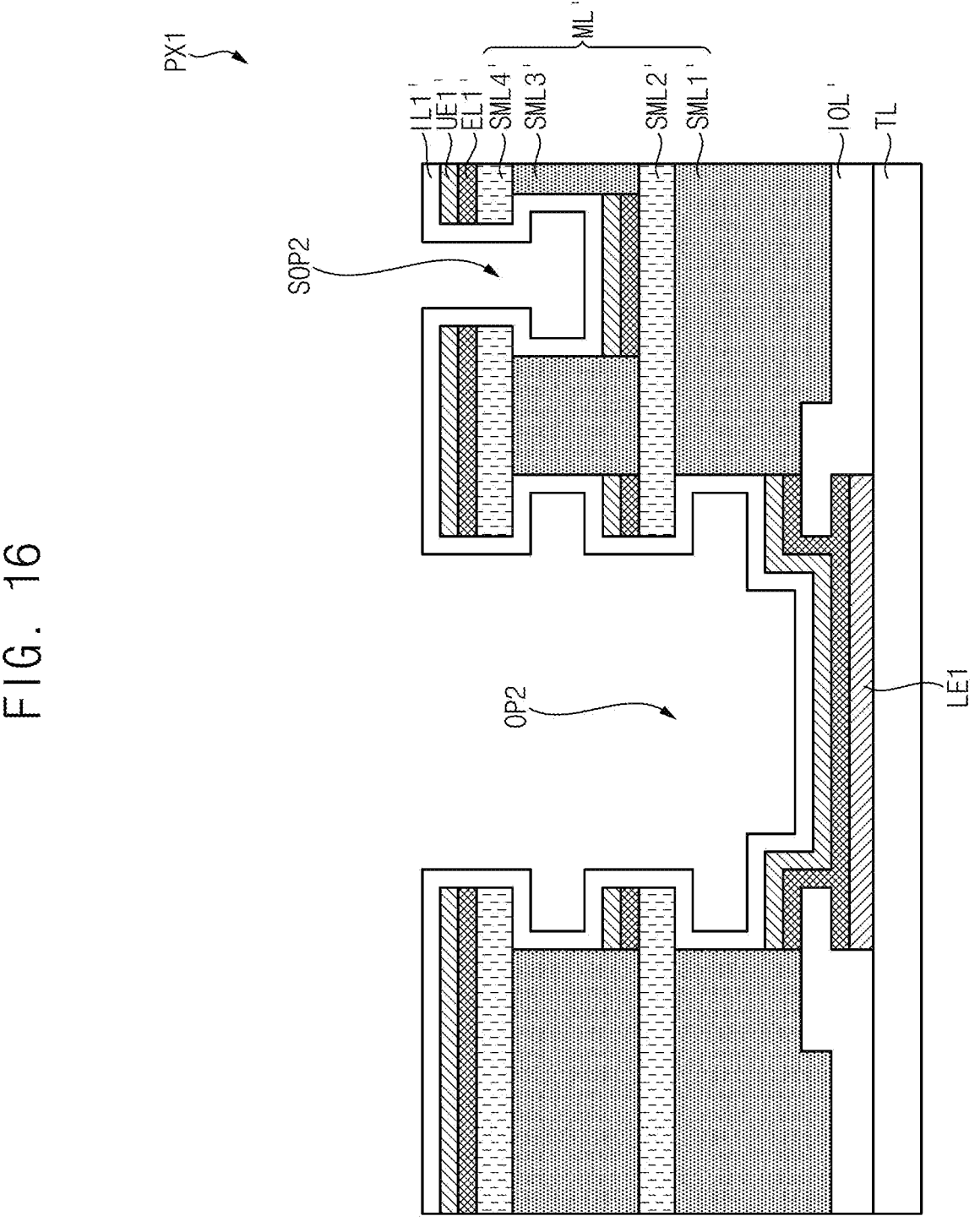

Referring to FIG. 16, a preliminary first insulating layer IL1' may be formed on (e.g., disposed directly thereon) the preliminary first upper electrode UE1'. In an embodiment, the preliminary first insulating layer IL1' may be formed to cover the preliminary first light emitting layer EL1', the preliminary first upper electrode UE1' and the preliminary metal layer ML'. The preliminary first insulating layer IL1' may include the same material as the first insulating layer IL1.

In an embodiment, the preliminary first insulating layer IL1' may be formed without using a mask. As the preliminary first insulating layer IL1' is formed without using the mask, the preliminary first insulating layer IL1' may be formed in all areas of the display device 10.

Figure 17:
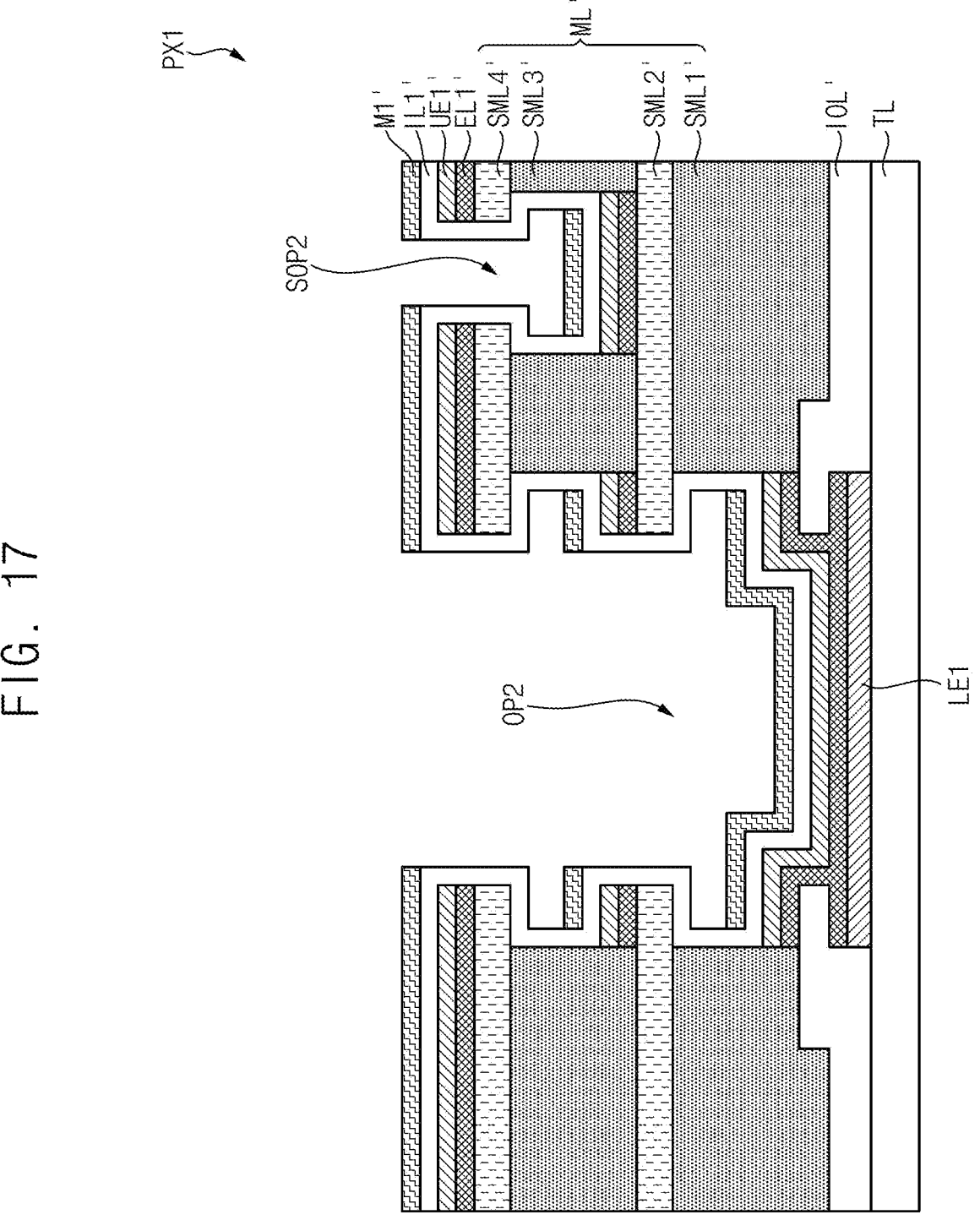

Referring to FIG. 17, a preliminary first protective layer M1' may be formed on the preliminary first insulating layer IL1'. The preliminary first protective layer M1' may include the same material as the first protective layer M1.

Figure 18:
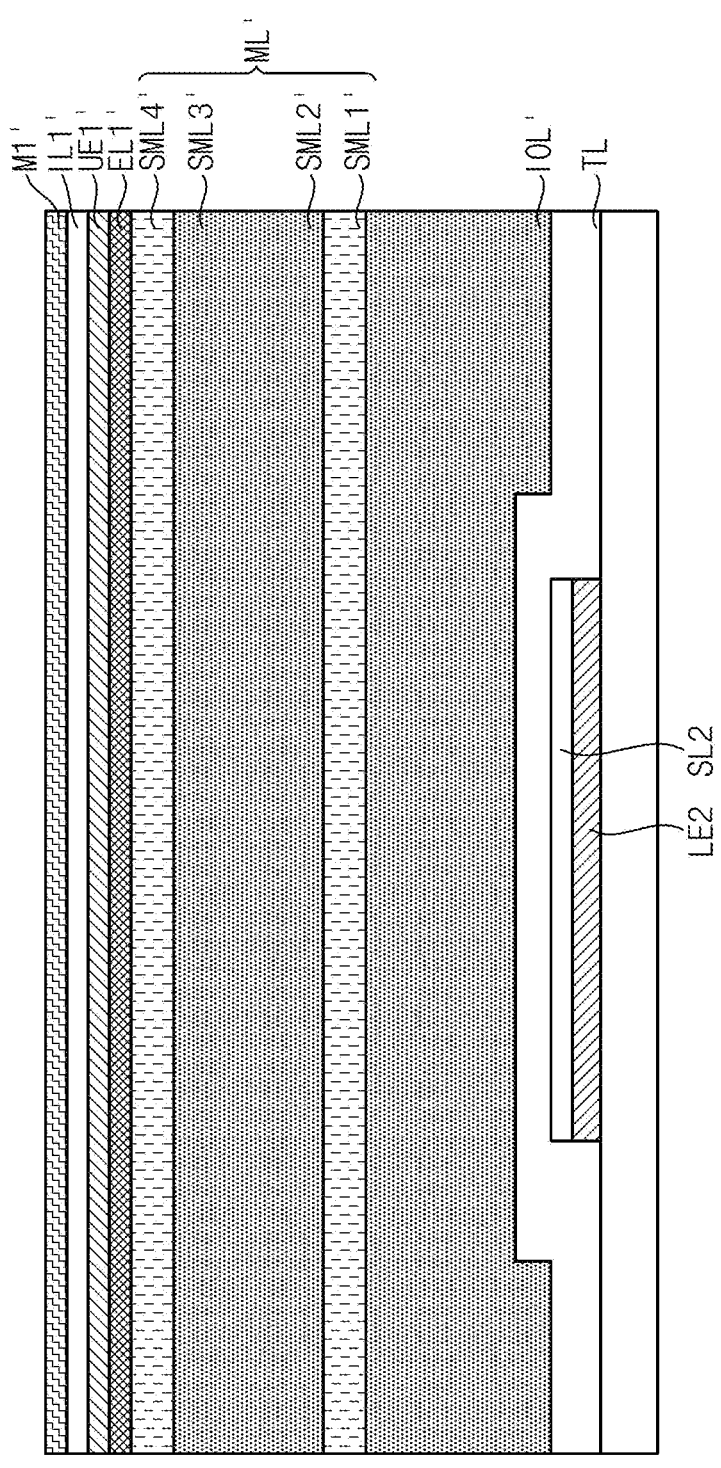

Referring to FIG. 18, the second lower electrode and a second sacrificial layer SL2 covering the entire upper surface of the second lower electrode LE2 may be formed on the substrate SUB of the transistor layer TL. The preliminary inorganic layer IOL' covering the second lower electrode LE2 and the second sacrificial layer SL2 may be formed on the transistor layer TL. The preliminary metal layer ML', the preliminary first light emitting layer EL1', the preliminary first upper electrode UE1', the preliminary first insulating layer IL1' and the preliminary first protective layer M1' may be sequentially formed on the preliminary inorganic layer IOL'.

Figure 19:
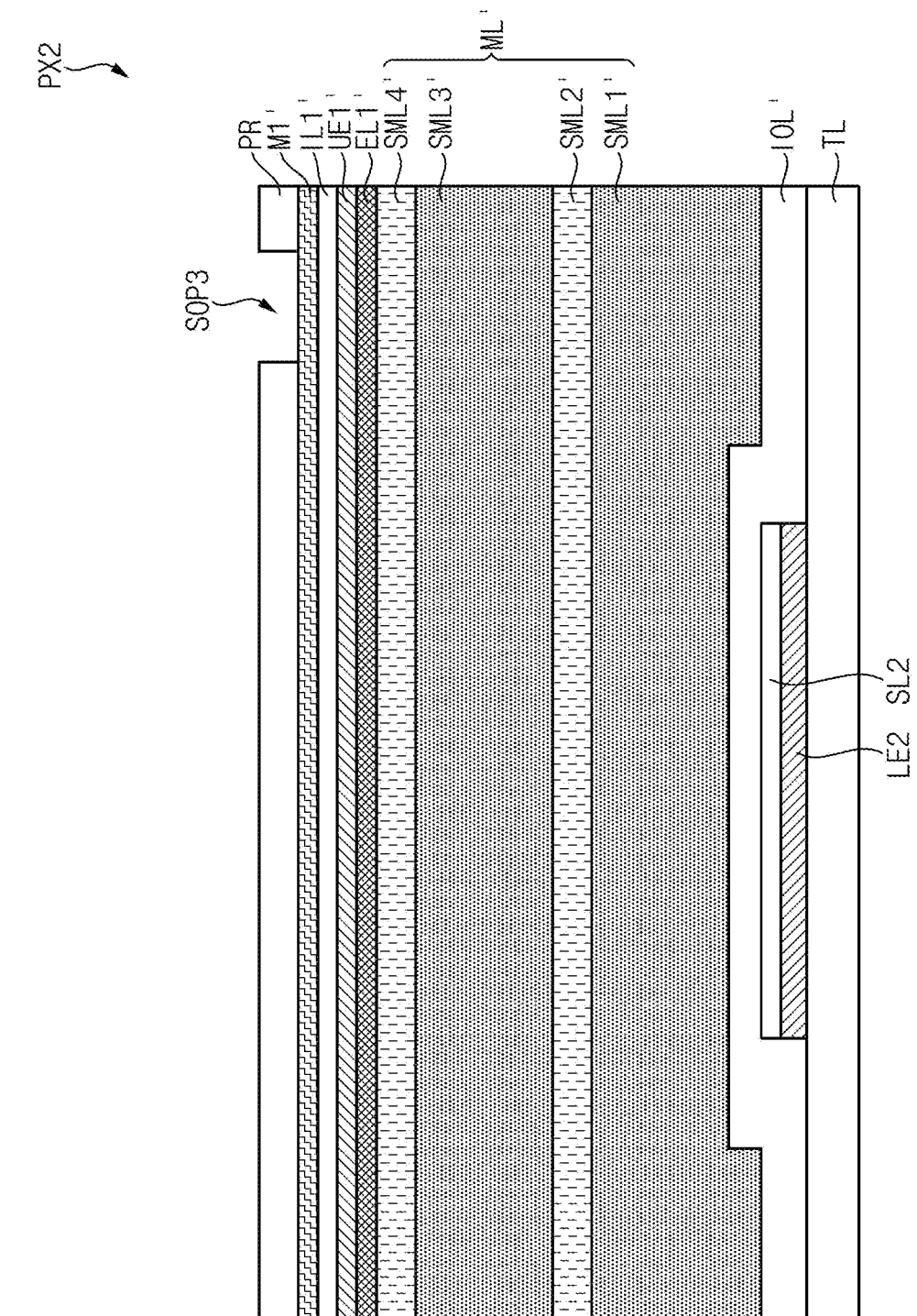

Referring to FIG. 19, a photoresist layer PR may be formed on the preliminary first protective layer M1'. A third sub-opening SOP3 may be formed by patterning the photoresist layer PR, and the third sub-opening SOP3 may expose the preliminary first protective layer M1' between the second lower electrode LE2 and the third lower electrode LE3.

Figure 20:
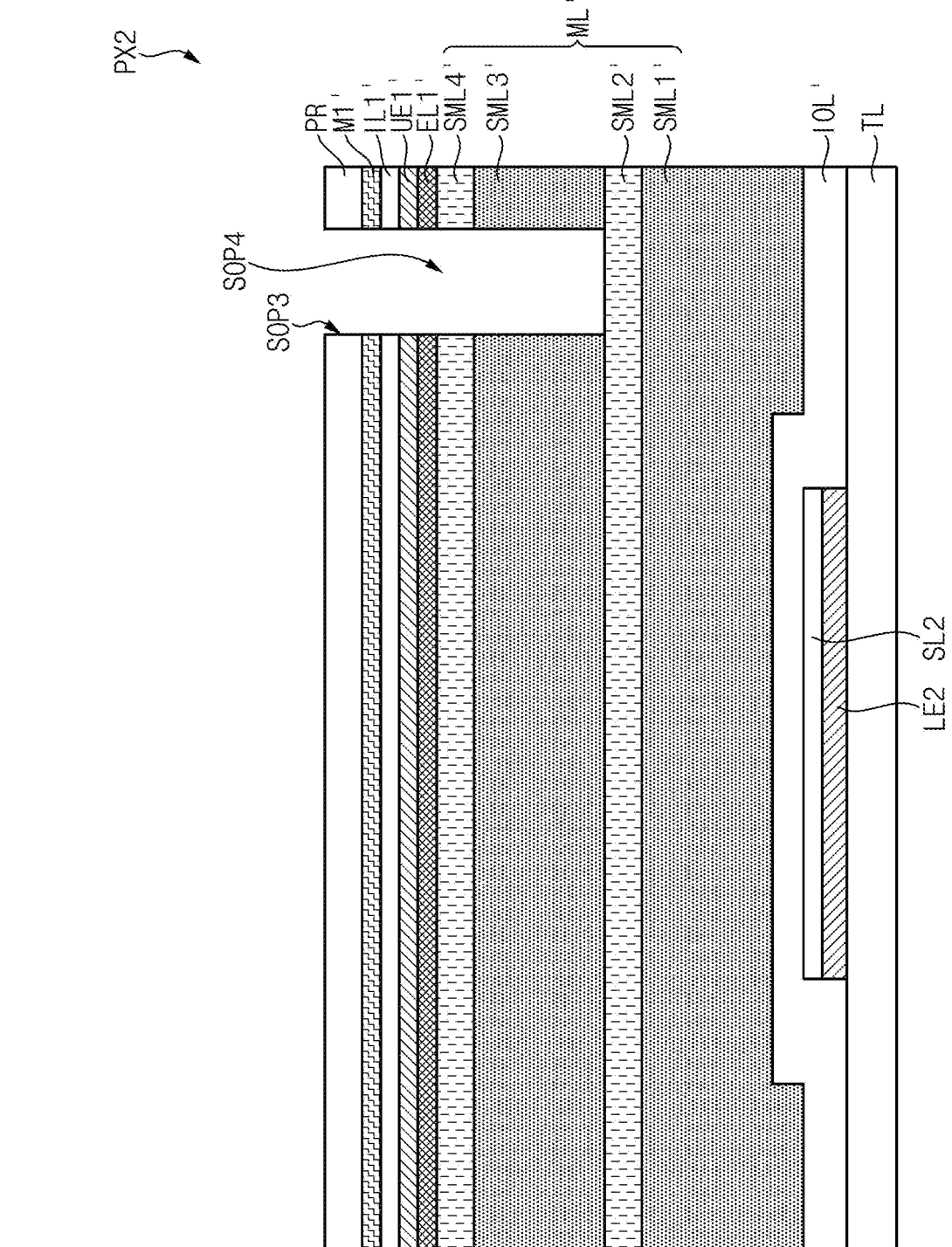

Referring to FIG. 20, the fourth sub-opening SOP4 connected to the third sub-opening SOP3 and exposing the preliminary second sub-metal layer SML2' may be formed. For example, in an embodiment the fourth sub-opening SOP4 may be formed by partially removing the preliminary first protective layer M1' by a wet etching method and partially removing the preliminary third sub-metal layer SML3', the preliminary fourth sub-metal layer SML4', the preliminary first light emitting layer EL1', the preliminary first upper electrode UE1' and the first insulating layer IL1' by a dry etching method.

Figure 21:
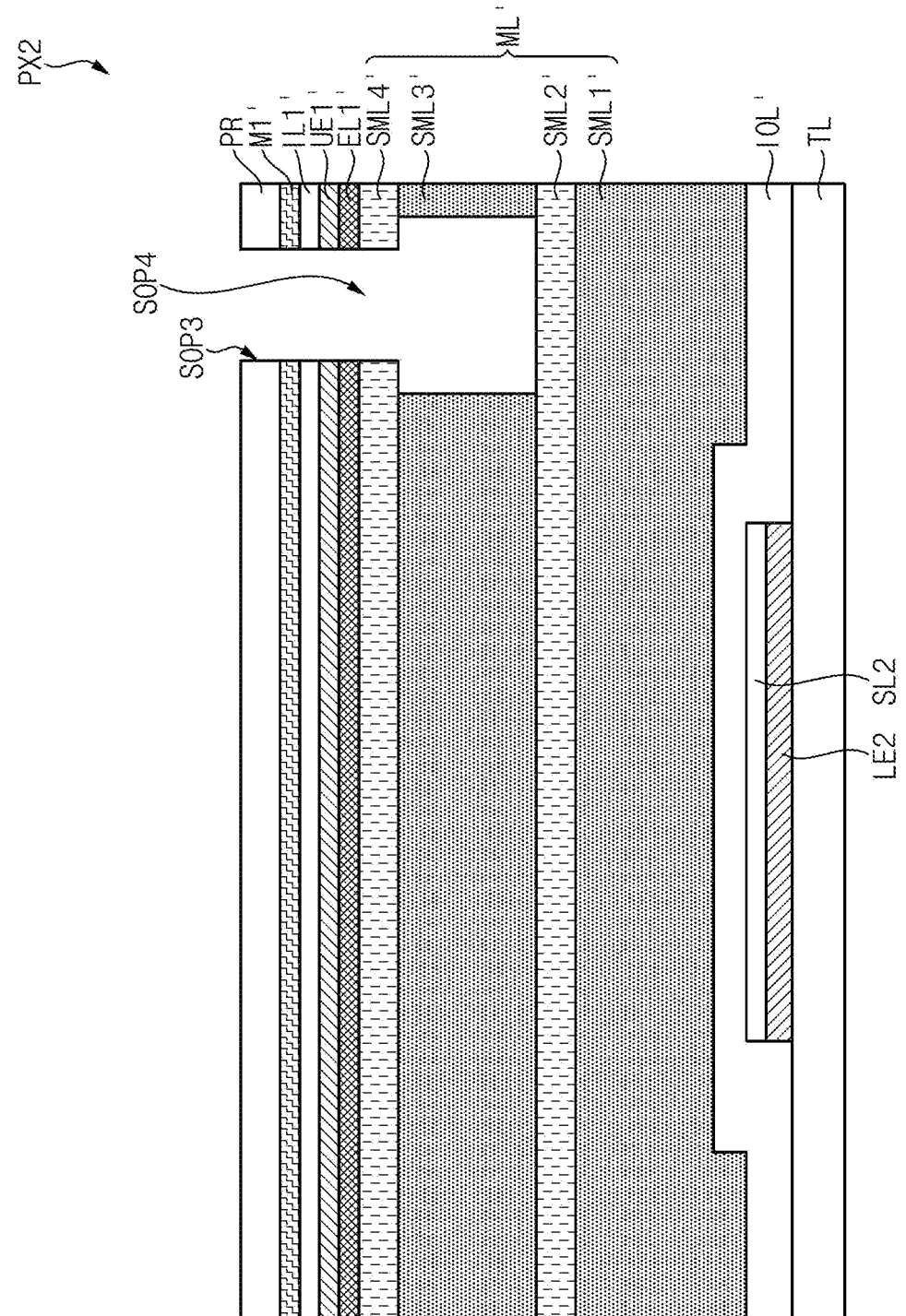

Referring to FIG. 21, the preliminary third sub-metal layer SML3' exposed by the fourth sub-opening SOP4 may be partially removed by a wet etching method. Accordingly, the fourth sub-opening SOP4 may have an undercut structure.

Figure 22:
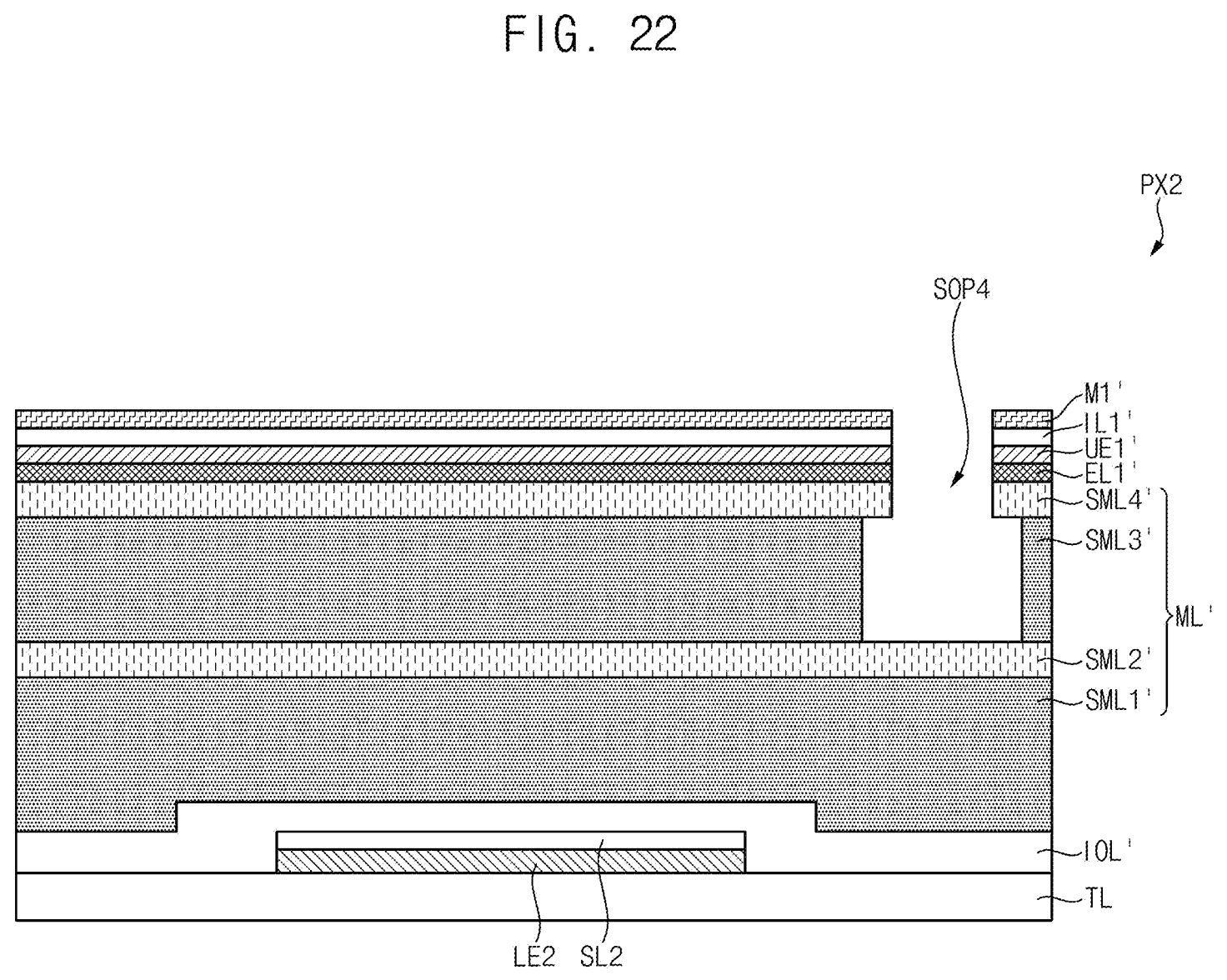

Referring to FIG. 22, the photoresist layer PR may be removed.

Figure 23:
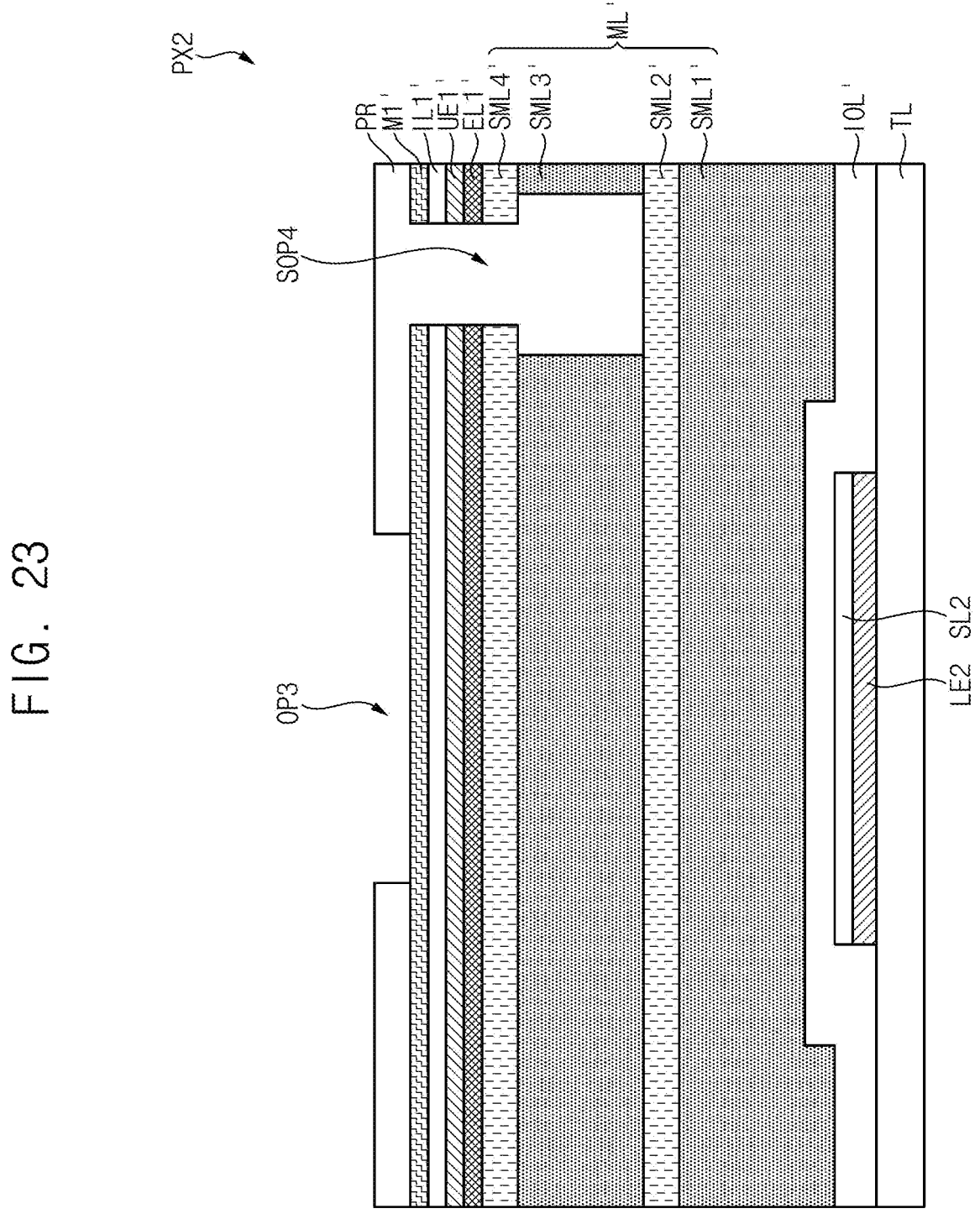

Referring to FIG. 23, a photoresist layer PR may be formed on the preliminary first protective layer M1'. A third opening OP3 may be formed by patterning the photoresist layer PR. The third opening OP3 may expose the preliminary first protective layer M1' overlapping the second lower electrode LE2 (e.g., in a thickness direction of the substrate SUB).

Figure 24:
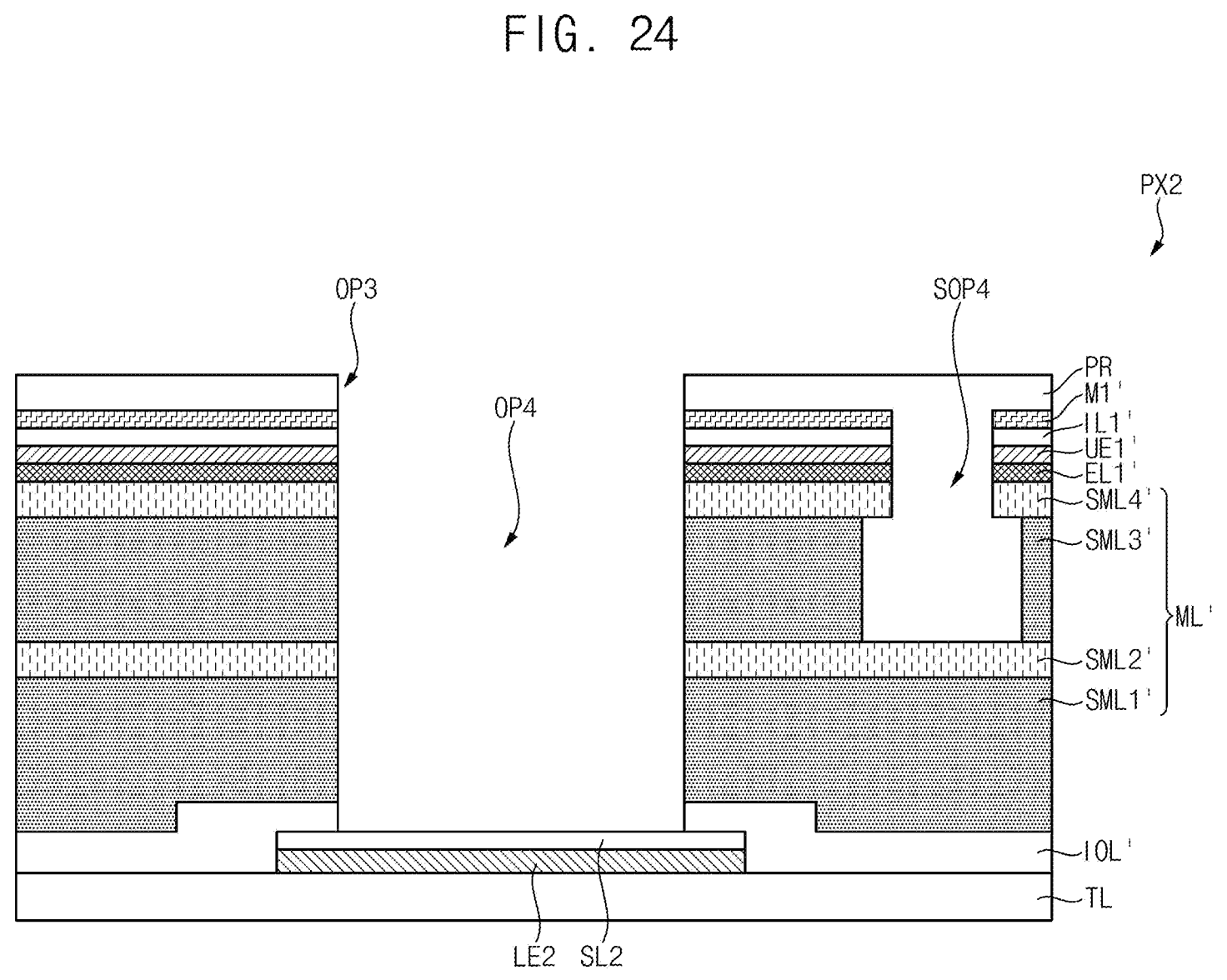

Referring to FIG. 24, the fourth opening OP4 connected to the third opening OP3 and exposing the second sacrificial layer SL2 may be formed. For example, in an embodiment the fourth opening OP4 may be formed by partially removing the preliminary first protective layer M1' by a wet etching method and partially removing the preliminary inorganic layer IOL', the preliminary metal layer ML', the preliminary first light emitting layer EL1', the preliminary first upper electrode UE1' and the preliminary first insulating layer IL1' by a dry etching method.

In this embodiment, since the second sacrificial layer SL2 covers the entire upper surface of the second lower electrode LE2, the second lower electrode LE2 may not be removed by the dry etching method. For example, the second sacrificial layer SL2 may protect the second lower electrode LE2 from being etched by the dry etching method.

Figure 25:
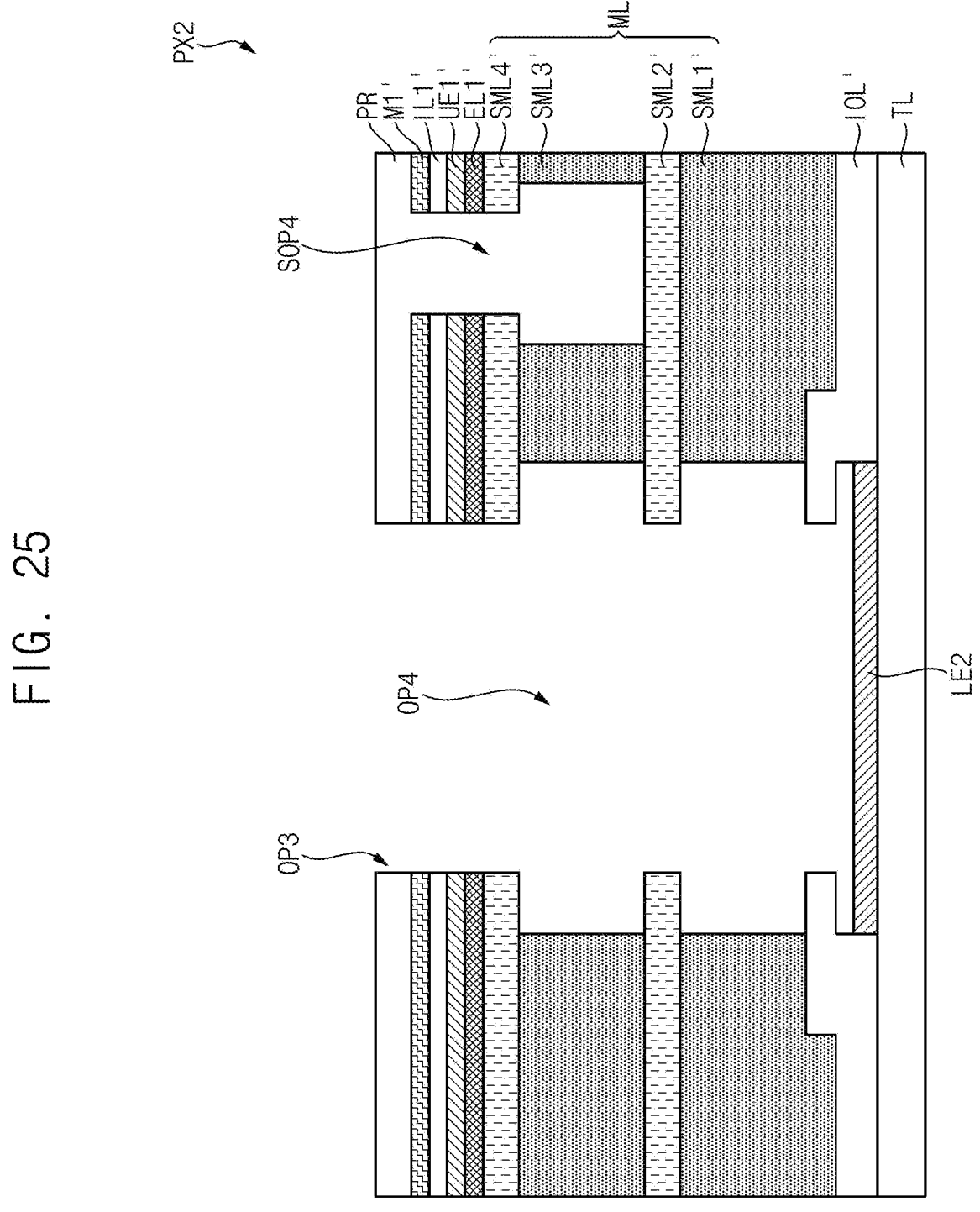

Referring to FIG. 25, in an embodiment the preliminary first sub-metal layer SML1' and the preliminary third sub-metal layer SML3' exposed by the fourth opening OP4 may be partially removed by a wet etching method. Accordingly, the preliminary second sub-metal layer SML2' and the preliminary fourth sub-metal layer SML4' may protrude from the preliminary first sub-metal layer SML1' and the preliminary third sub-metal layer SML3' (e.g., in a direction parallel to an upper surface of the substrate SUB).

The second sacrificial layer SL2 exposed by the fourth opening OP4 may be removed by the wet etching method. As the second sacrificial layer SL2 is removed, the fourth opening OP4 may have an undercut structure.

Figure 26:
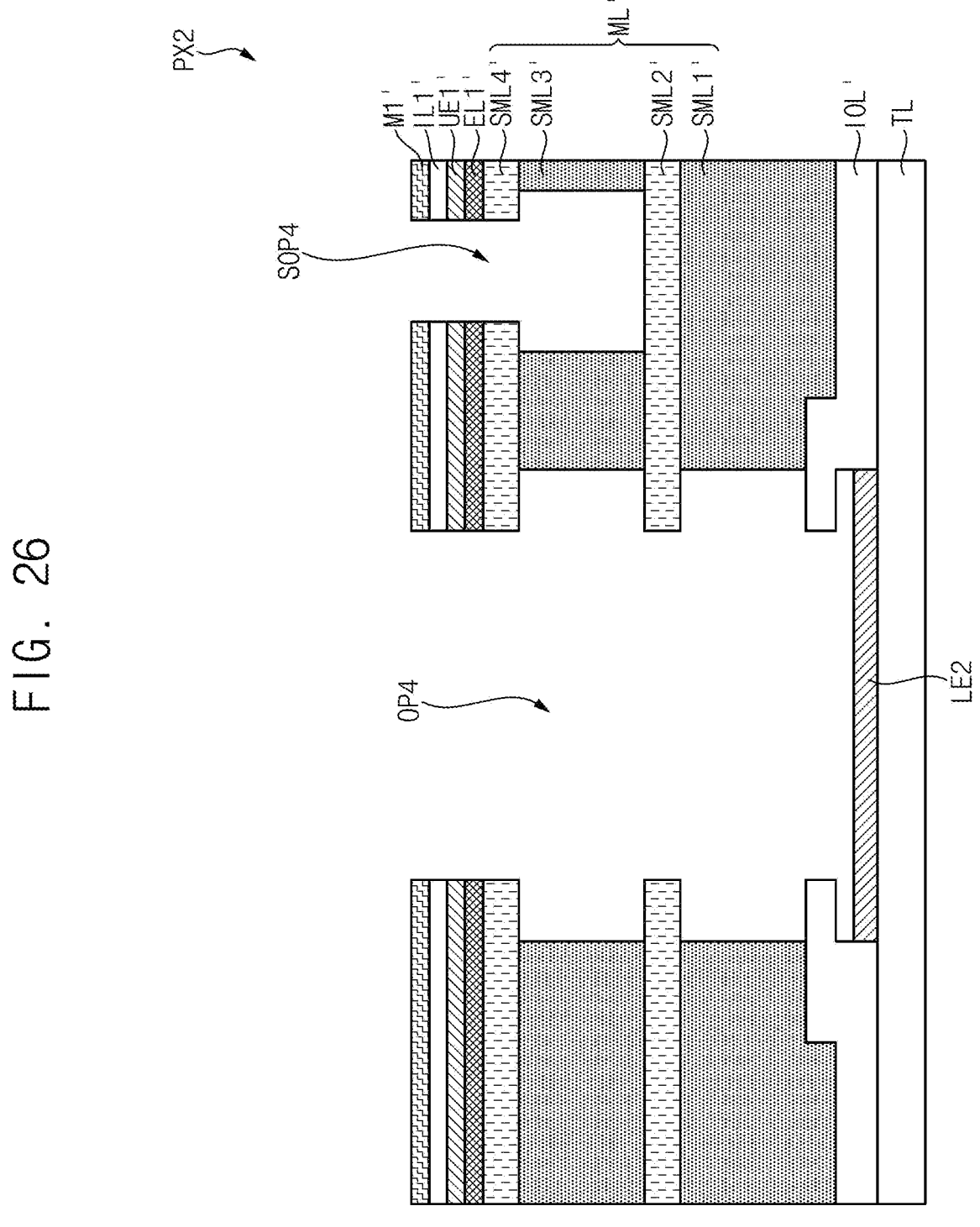

Referring to FIG. 26, the photoresist layer PR may be removed.

Figure 27:
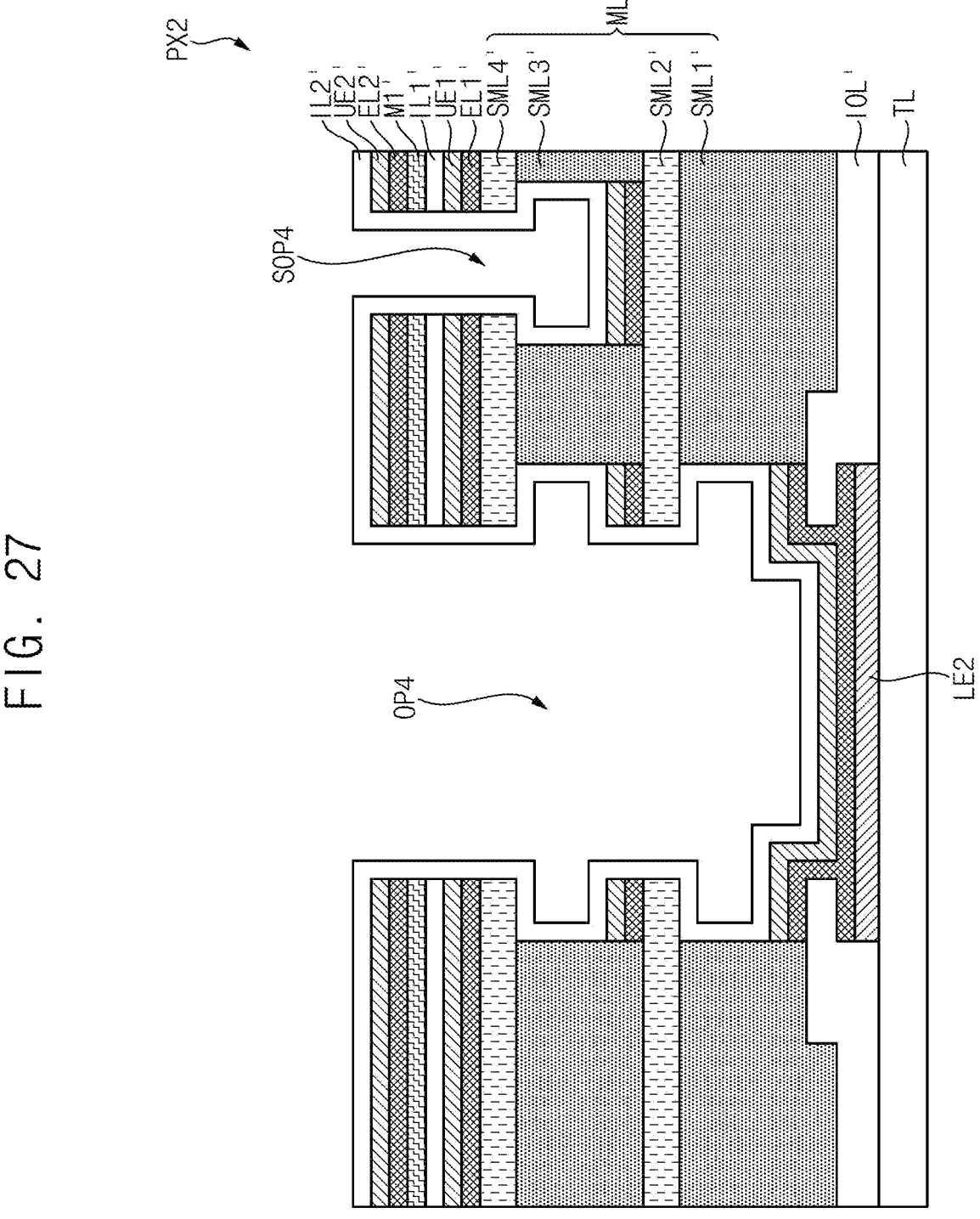

Referring to FIG. 27, a preliminary second light emitting layer EL2' may be formed on the second lower electrode LE2 and the preliminary metal layer ML'. For example, the preliminary second light emitting layer EL2' may be formed on (e.g., disposed directly thereon) an entirety of the upper surface of the second lower electrode LE2, a portion where the preliminary inorganic layer IOL' protrudes from the fourth opening OP4, an upper surface of the preliminary second sub-metal layer SML2' in a portion of the preliminary second sub-metal layer SML2' protruding from the fourth opening OP4, an upper surface of the preliminary second sub-metal layer SML2' in the fourth sub-opening SOP4, and an upper surface of the preliminary first protective layer M1'. For example, the preliminary second light emitting layer EL2' may fill a space of the undercut structure of the fourth opening OP4. In an embodiment, the preliminary second light emitting layer EL2' may include the same material as the second light emitting layer EL2.

A preliminary second upper electrode UE2' may be formed on (e.g., disposed directly thereon) the preliminary second light emitting layer EL2'. The preliminary second upper electrode UE2' may include the same material as the second upper electrode UE2.

A preliminary second insulating layer IL2' may be formed on (e.g., disposed directly thereon) the preliminary second upper electrode UE2'. In an embodiment, the preliminary second insulating layer IL2' may be formed to cover the preliminary second light emitting layer EL2', the preliminary second upper electrode UE2' and the preliminary metal layer ML'. The preliminary second insulating layer IL2' may include the same material as the second insulating layer IL2.

In an embodiment, the preliminary second light emitting layer EL2', the preliminary second upper electrode UE2' and the preliminary second insulating layer IL2' may be formed without using a mask. Accordingly, the preliminary second light emitting layer EL2', the preliminary second upper electrode UE2' and the preliminary second insulating layer IL2' may be formed in all regions of the display device 10.

Figure 28:
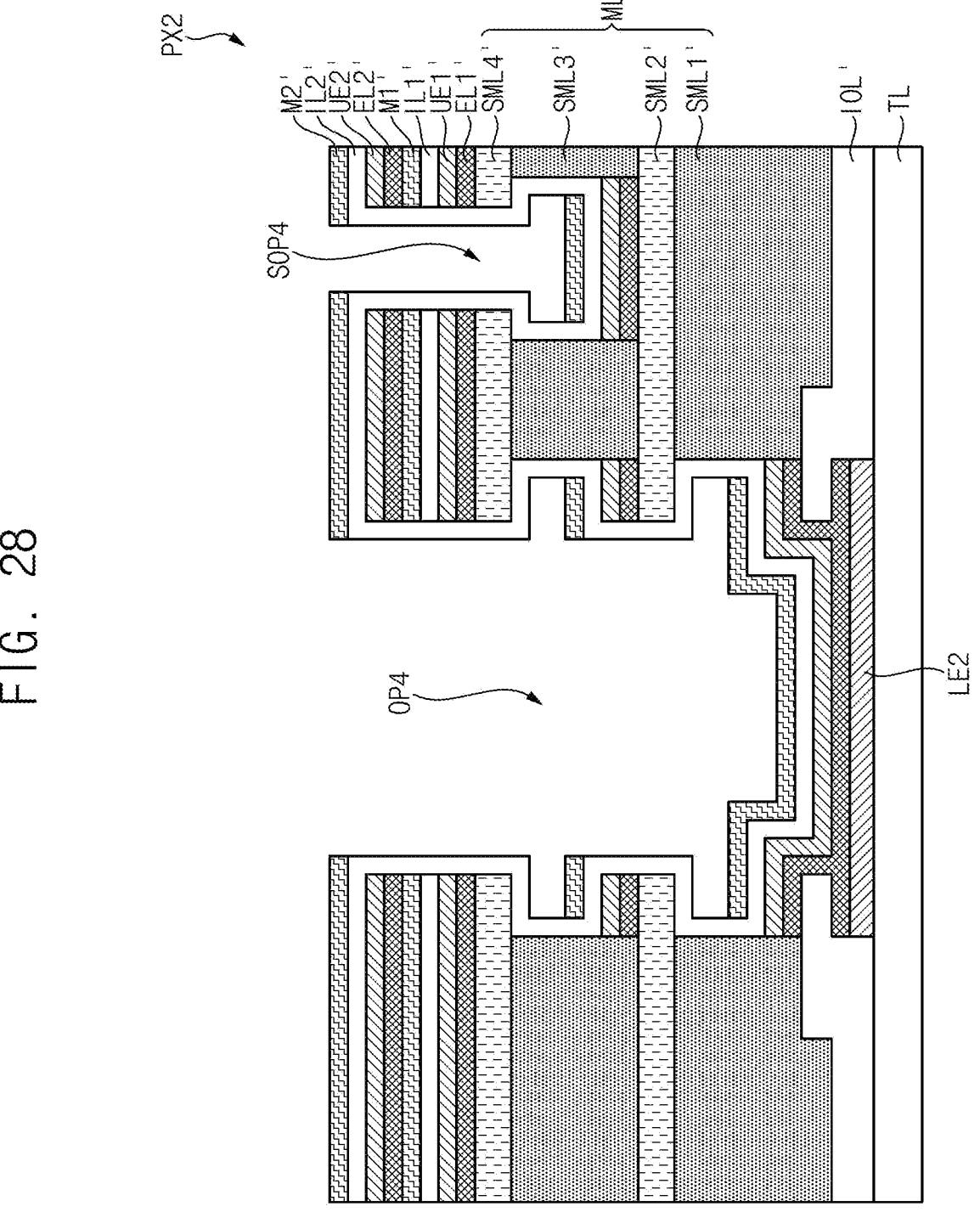

Referring to FIG. 28, a preliminary second protective layer M2' may be formed on (e.g., disposed directly thereon) the preliminary second insulating layer IL2'. The preliminary second protective layer M2' may include the same material as the second protective layer M2.

Figure 29:
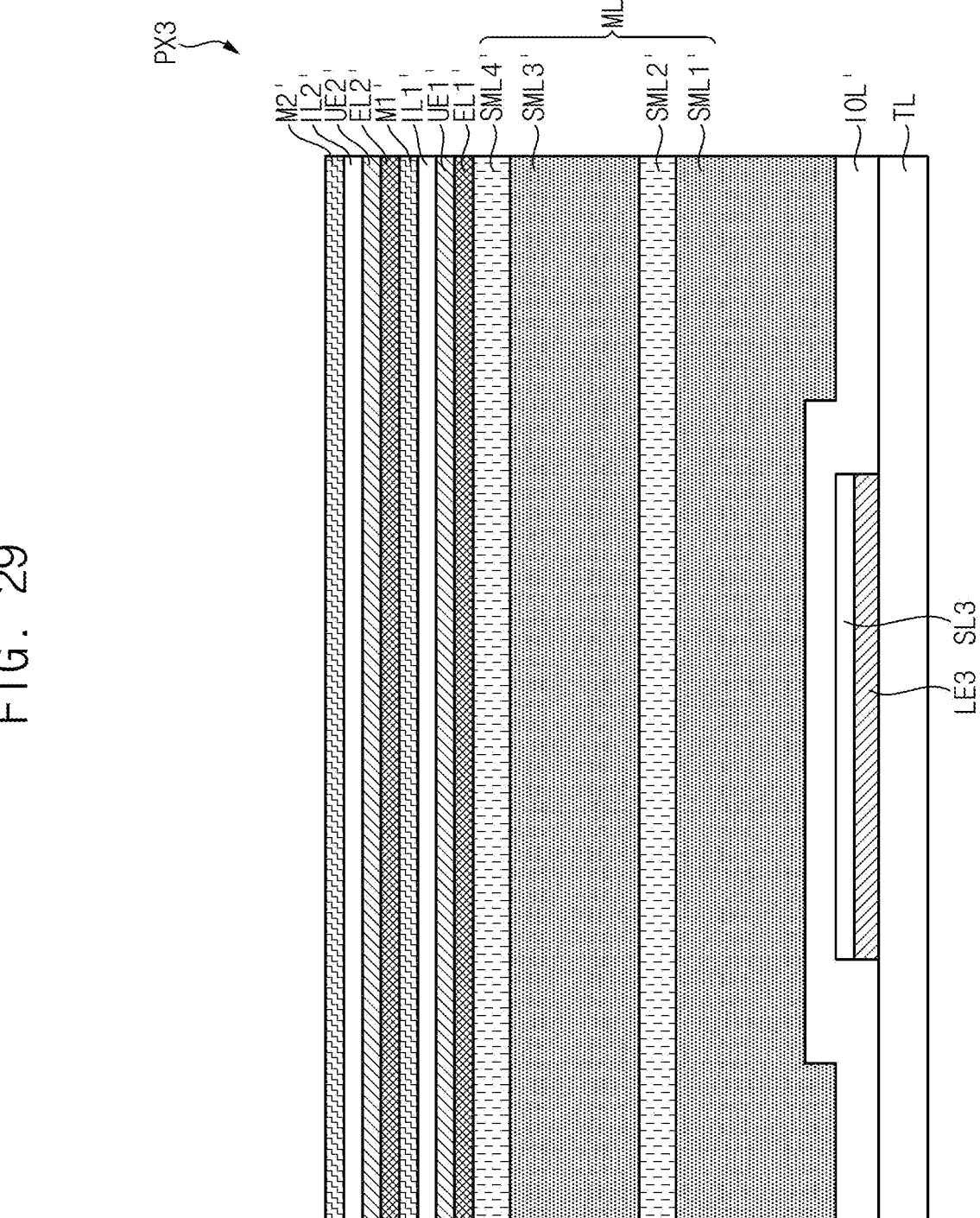

Referring to FIG. 29, the third lower electrode LE3 and a third sacrificial layer SL3 covering the entire upper surface of the third lower electrode LE3 may be formed on the transistor layer TL. The preliminary inorganic layer IOL' covering the third lower electrode LE3, and the third sacrificial layer SL3 may be formed on the transistor layer TL. The preliminary metal layer ML', the preliminary first light emitting layer EL1', the preliminary first upper electrode UE1', the preliminary first insulating layer IL1', the preliminary first protective layer M1', the preliminary second light emitting layer EL2', the preliminary second upper electrode UE2', the preliminary second insulating layer IL2', and the preliminary second protective layer M2' may be sequentially formed on the preliminary inorganic layer IOL'.

Figure 30:
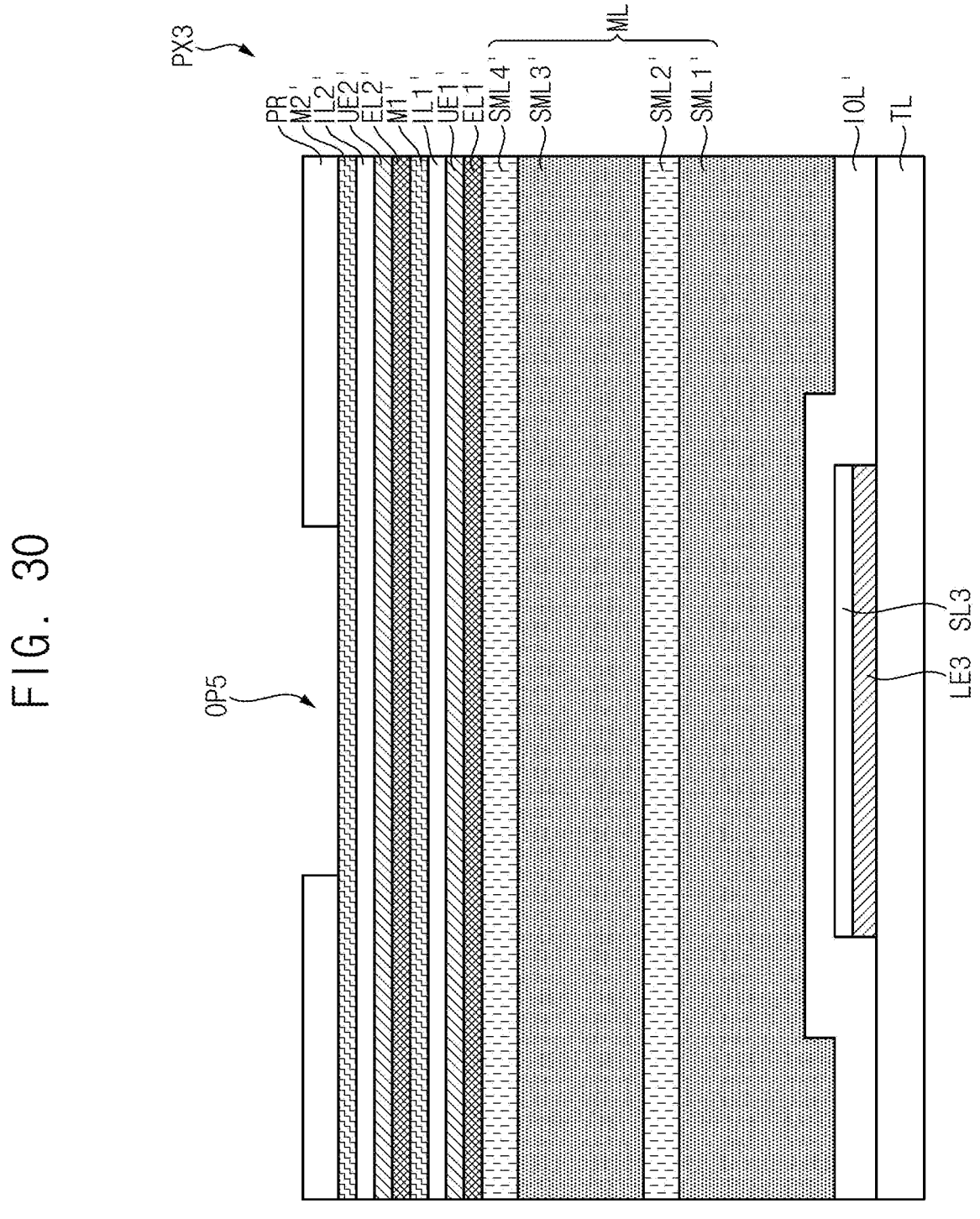

Referring to FIG. 30, a photoresist layer PR may be formed on the preliminary second protective layer M2'. A fifth opening OP5 may be formed by patterning the photoresist layer PR. The fifth opening OP5 may expose the preliminary second protective layer M2' overlapping the third lower electrode LE3 (e.g., in a thickness direction of the substrate SUB).

Figure 31:
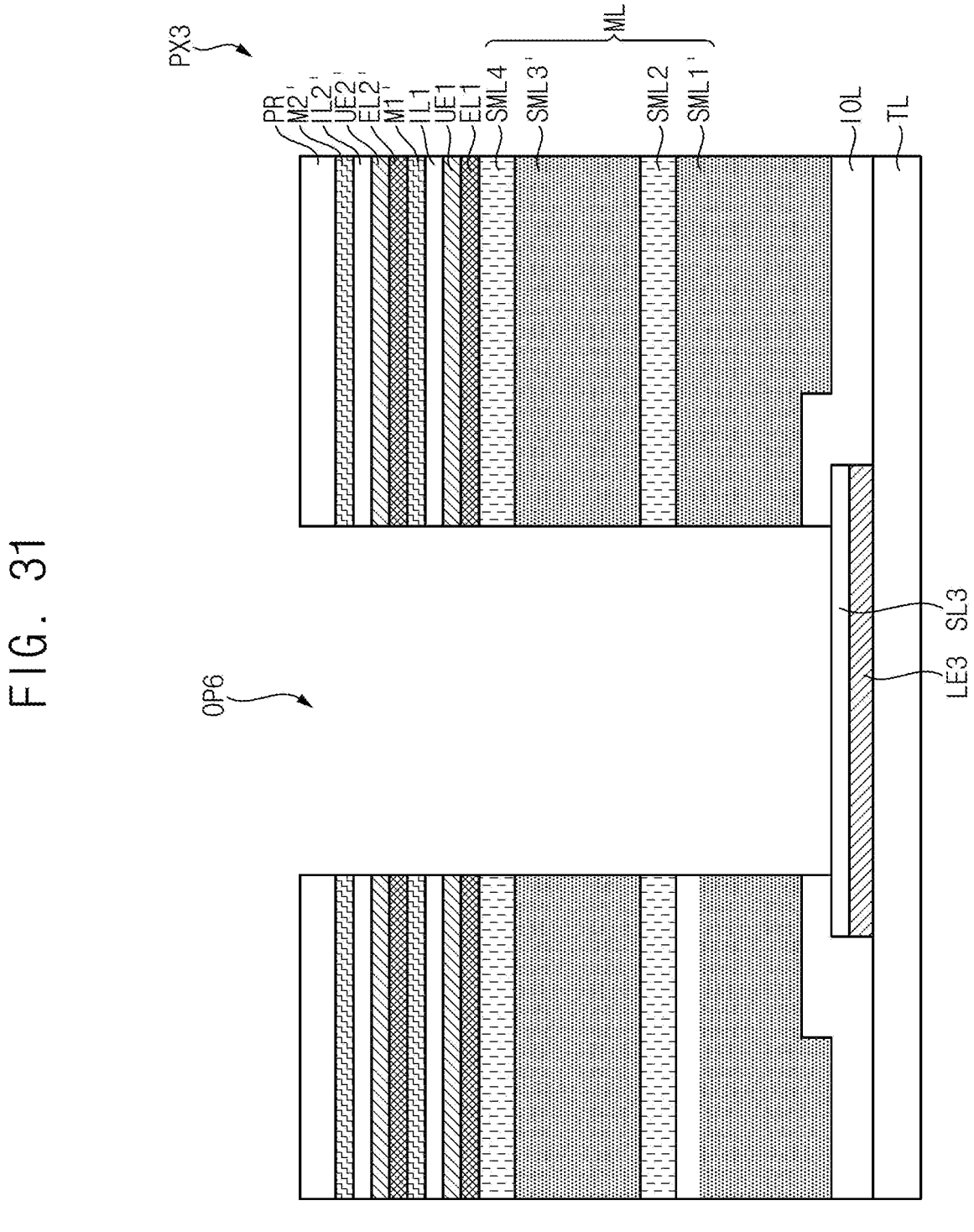

Referring to FIG. 31, the sixth opening OP6 connected to the fifth opening OP5 and exposing the third sacrificial layer SL3 may be formed. For example, in an embodiment the sixth opening OP6 may be formed by partially removing the preliminary first protective layer M1' and the preliminary second protective layer M2' by a wet etching method and partially removing and the preliminary inorganic layer IOL', the preliminary metal layer ML', the preliminary first light emitting layer EL1', the preliminary first upper electrode UE1', the preliminary first insulating layer IL1', the preliminary second light emitting layer EL2', the preliminary second upper electrode UE2' and the preliminary second insulating layer IL2' by a dry etching method.

In an embodiment, the inorganic layer IOL, the second sub-metal layer SML2, the fourth sub-metal layer SML4, the first light emitting layer EL1, the first upper electrode UE1 and the first insulating layer IL1 may be respectively formed by partially removing the preliminary inorganic layer IOL', the preliminary second sub-metal layer SML2', the preliminary fourth sub-metal layer SML4', the preliminary first light emitting layer EL1', the preliminary first upper electrode UE1' and the preliminary first insulating layer IL1'.

In this embodiment, since the third sacrificial layer SL3 covers the entire upper surface of the third lower electrode LE3, the third lower electrode LE3 may not be removed by the dry etching method. For example, the third sacrificial layer SL3 may protect the third lower electrode LE3 from being etched by the dry etching method.

Figure 32:
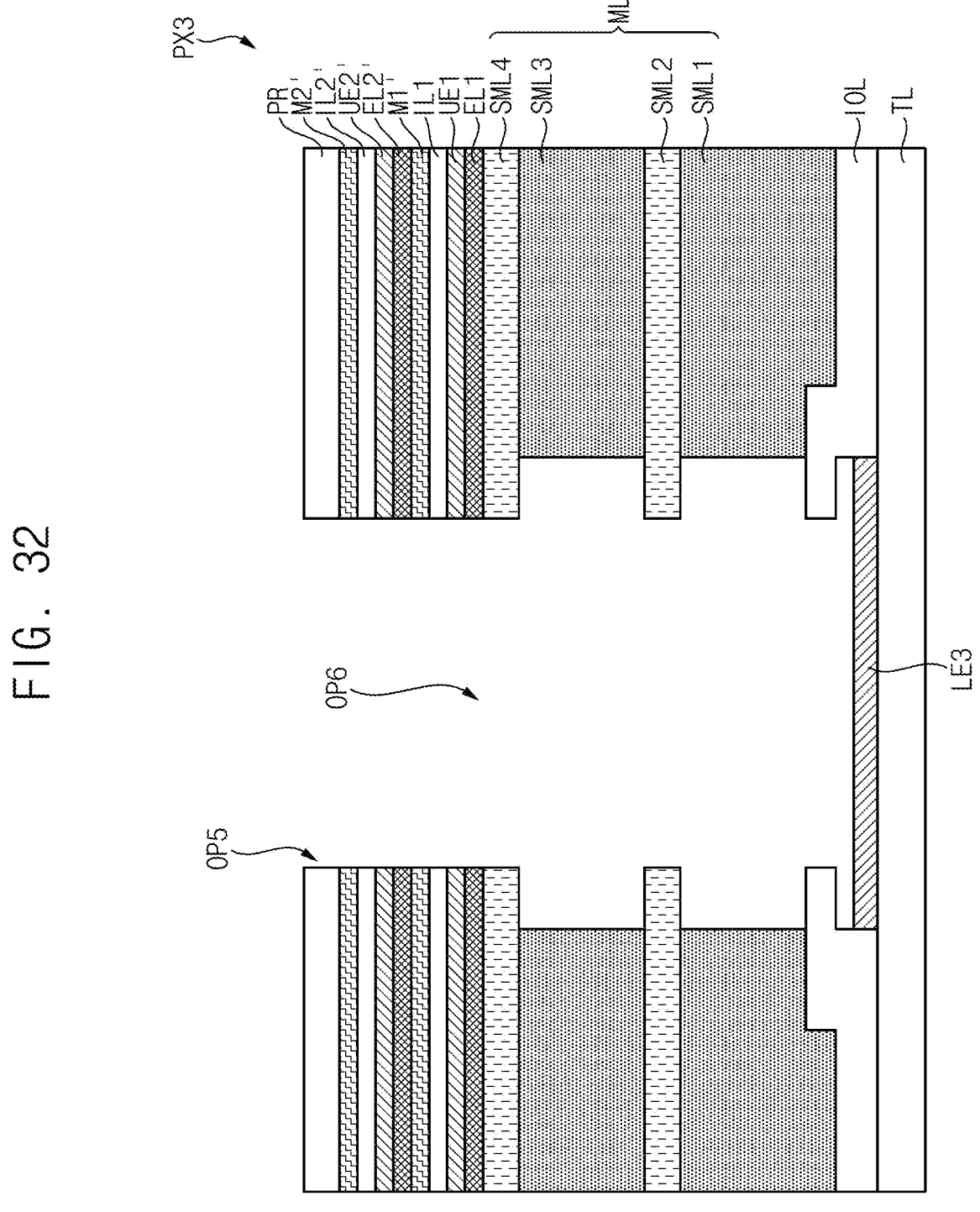

Referring to FIG. 32, in an embodiment the preliminary first sub-metal layer SML1' and the preliminary third sub-metal layer SML3' exposed by the sixth opening OP6 may be partially removed by a wet etching method. Accordingly, the preliminary second sub-metal layer SML2' and the preliminary fourth sub-metal layer SML4' may protrude from the preliminary first sub-metal layer SML1' and the preliminary third sub-metal layer SML3'.

In an embodiment, the first sub-metal layer SML1 and the third sub-metal layer SML3 may be respectively formed by partially removing the preliminary first sub-metal layer SML1' and the preliminary third sub-metal layer SML3'. For example, the metal layer ML may be formed.

The third sacrificial layer SL3 exposed by the sixth opening OP6 may be removed by the wet etching method. As the third sacrificial layer SL3 is removed, the sixth opening OP6 may have an undercut structure.

Figure 33:
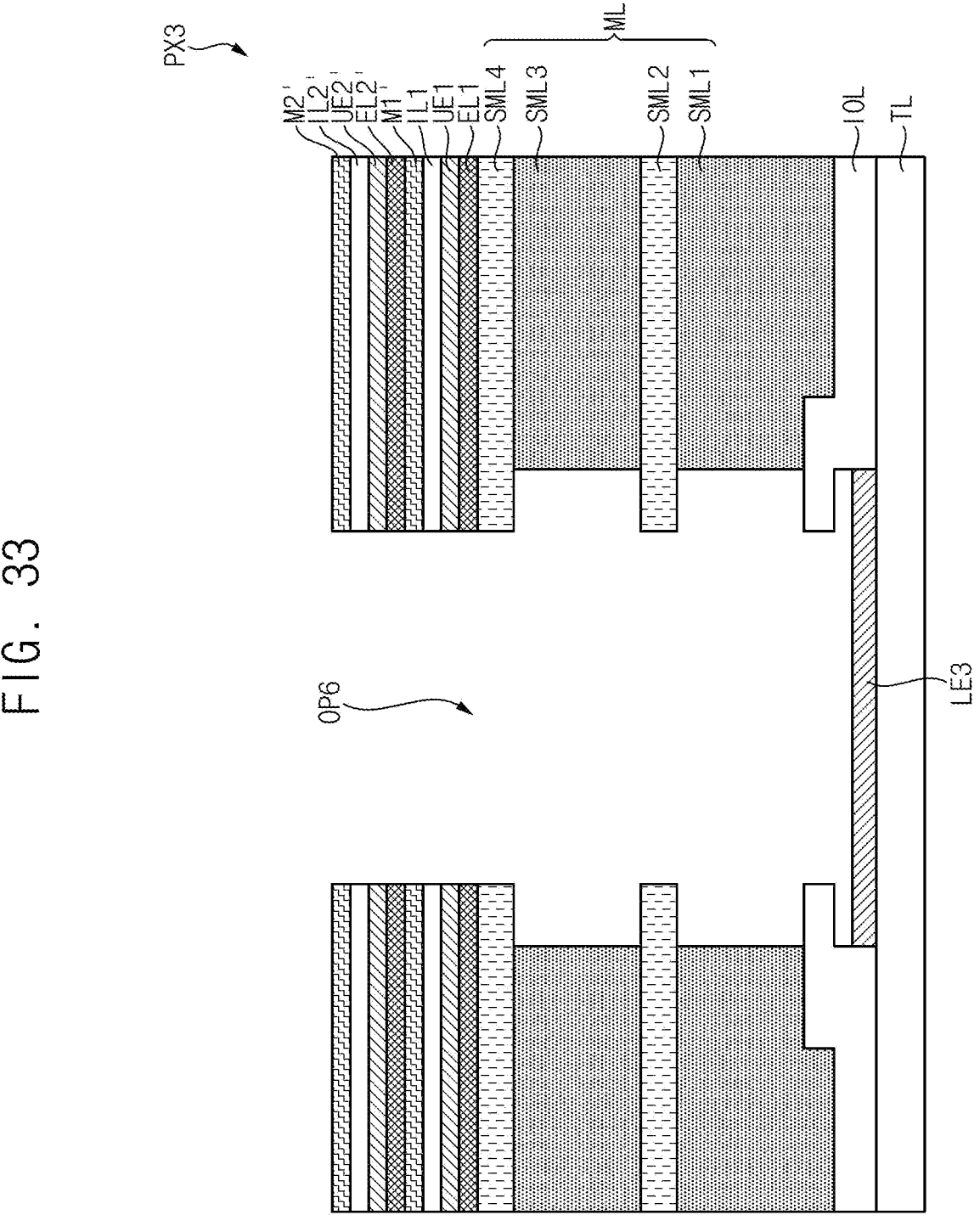

Referring to FIG. 33, the photoresist layer PR may be removed.

Figure 34:
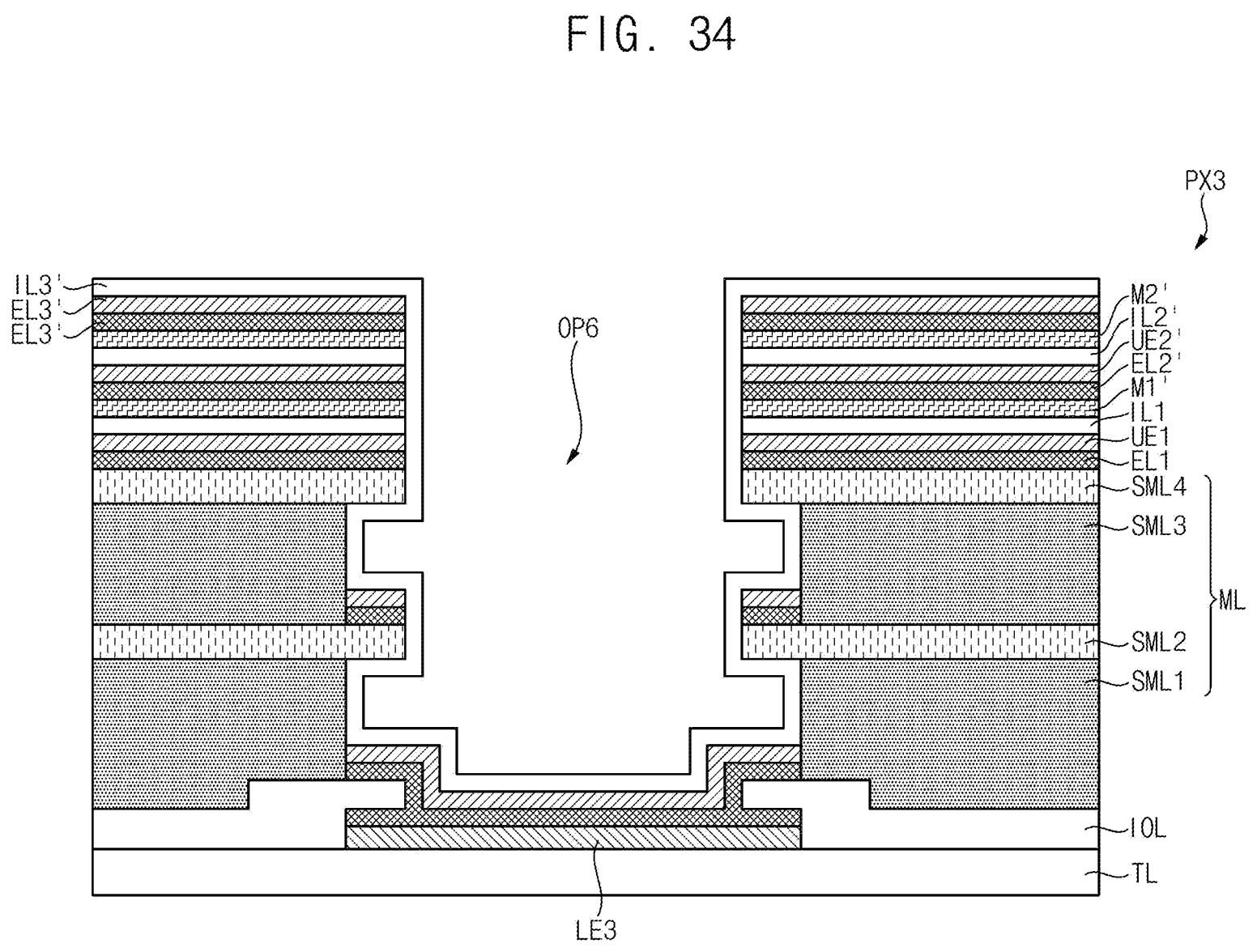

Referring to FIGS. 34 and 35, a preliminary third light emitting layer EL3' may be formed on the third lower electrode LE3 and the metal layer ML.

For example, the preliminary third light emitting layer EL3' may be formed on (e.g., disposed directly thereon) an entirety of the upper surface of the third lower electrode LE3, a portion where the inorganic layer IOL protrudes from the sixth opening OP6, an upper surface of the second sub-metal layer SML2 in a portion of the second sub-metal layer SML2 protruding from the sixth opening OP6, and an upper surface of the preliminary second protective layer M2'. For example, the preliminary third light emitting layer EL3' may fill a space of the undercut structure of the sixth opening OP6. In an embodiment, the third preliminary light emitting layer EL3' may include the same material as the third light emitting layer EL3.

A preliminary third upper electrode UE3' may be formed on (e.g., disposed directly thereon) the preliminary third light emitting layer EL3'. The preliminary third upper electrode UE3' may include the same material as the third upper electrode UE3'.

A third preliminary insulating layer IL3' may be formed on (e.g., disposed directly thereon) the preliminary third upper electrode UE3'. In an embodiment, the preliminary third insulating layer IL3' may be formed to cover the preliminary third light emitting layer EL3', the preliminary third upper electrode UE3' and the metal layer ML. The preliminary third insulating layer IL3' may include the same material as the third insulating layer IL3.

In an embodiment, the preliminary third light emitting layer EL3', the preliminary third upper electrode UE3' and the preliminary third insulating layer IL3' may be formed without using a mask. Accordingly, the preliminary third light emitting layer EL3', the preliminary third upper electrode UE3' and the preliminary third insulating layer IL3' may be formed in all regions of the display device 10.

Figure 36:
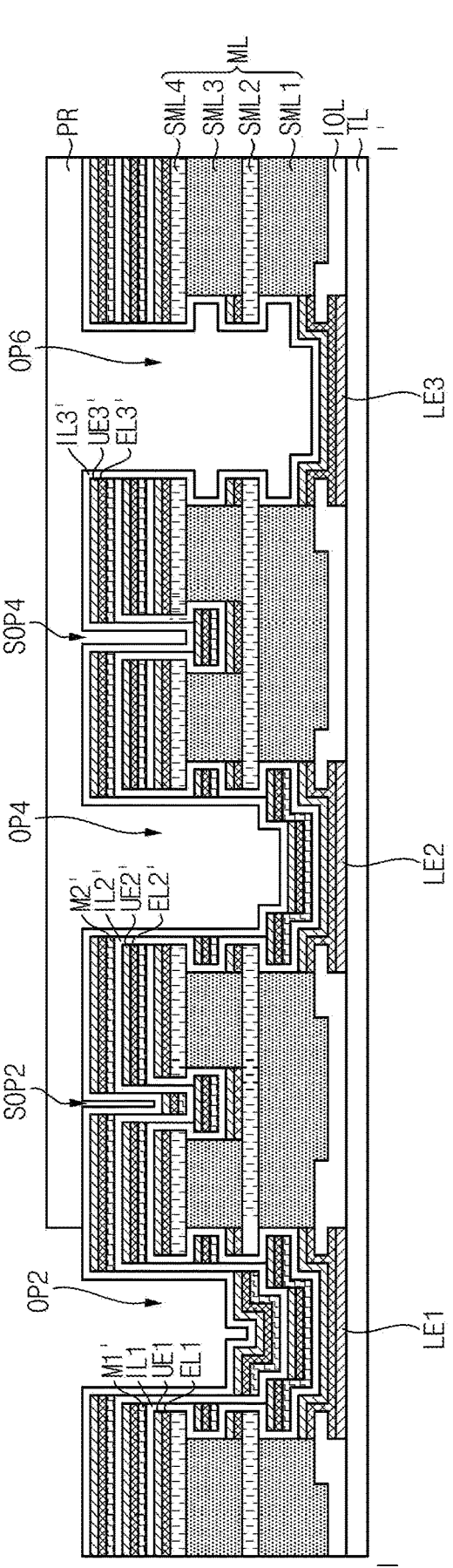

Referring to FIG. 36, a photoresist layer PR may be formed on the preliminary third insulating layer IL3'. The third preliminary insulating layer IL3' overlapping the first lower electrode LE1 may be exposed by patterning the photoresist layer PR.

Figure 37:
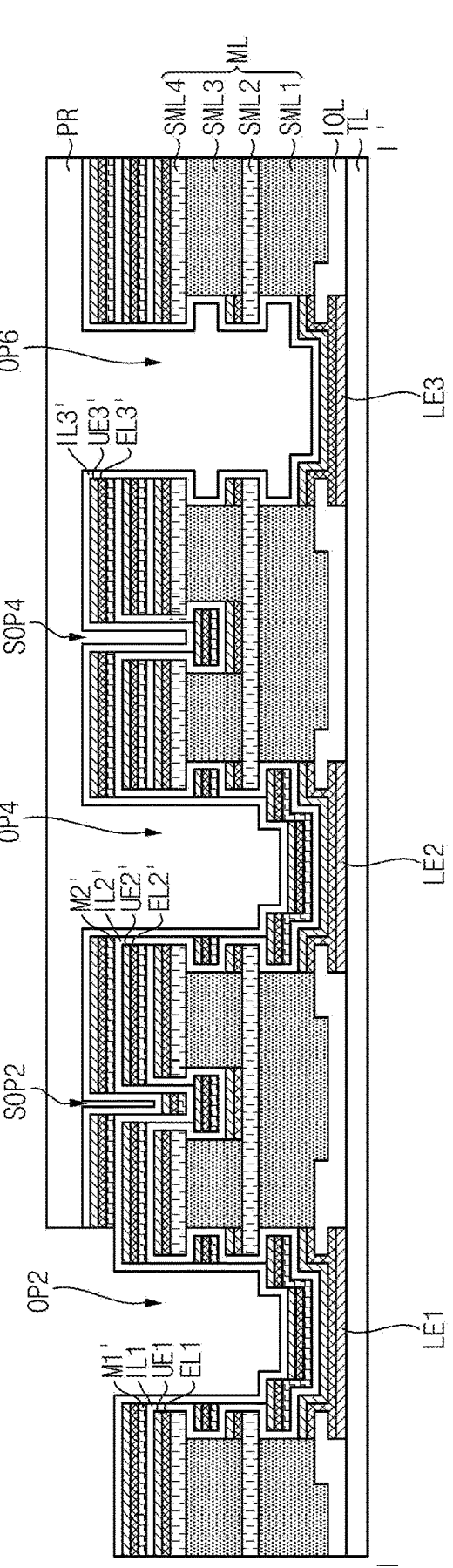

Referring to FIG. 37, the preliminary second protective layer M2', the preliminary third light emitting layer EL3', the preliminary third upper electrode UE3' and the third preliminary insulating layer IL3' respectively overlapping the first lower electrode LE1 may be removed. For example, in an embodiment the preliminary third light emitting layer EL3', the preliminary third upper electrode UE3' and the preliminary third insulating layer may be partially removed by a dry etching method, and the preliminary second protective layer M2' may be partially removed by a wet etching method.

In this embodiment, since the preliminary second protective layer M2' is disposed on the preliminary second insulating layer IL2', the preliminary second insulating layer IL2' may not be removed by the dry etching method. For example, the preliminary second protective layer M2' may protect the preliminary second insulating layer IL2' from being etched by the dry etching method.

Figure 38:
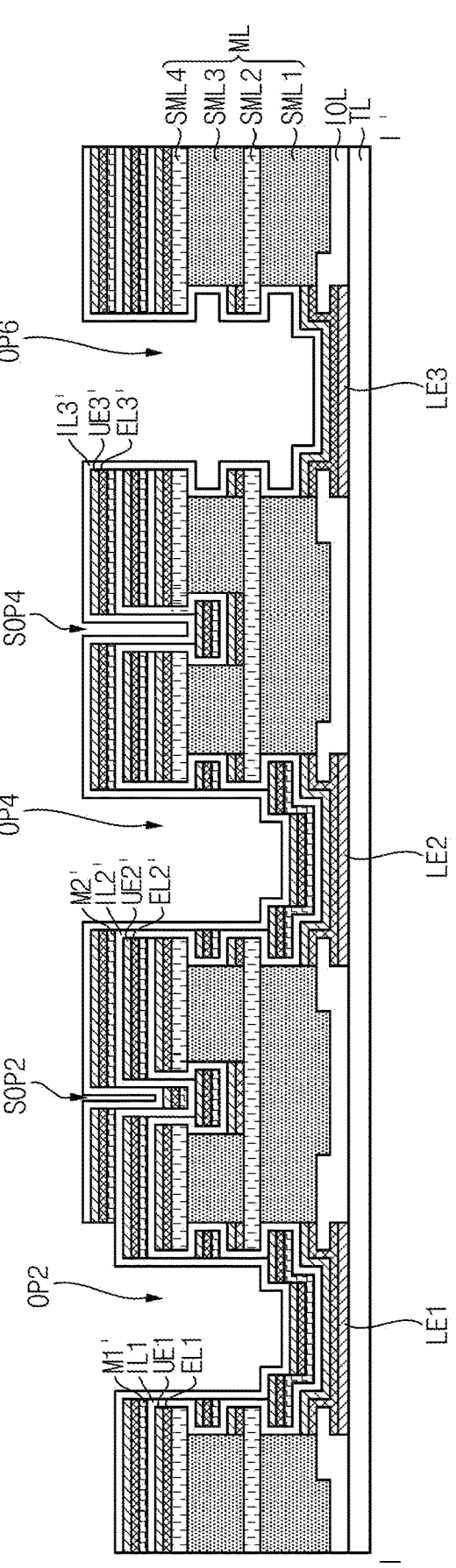

Referring to FIG. 38, the photoresist layer PR may be removed.

Figure 39:
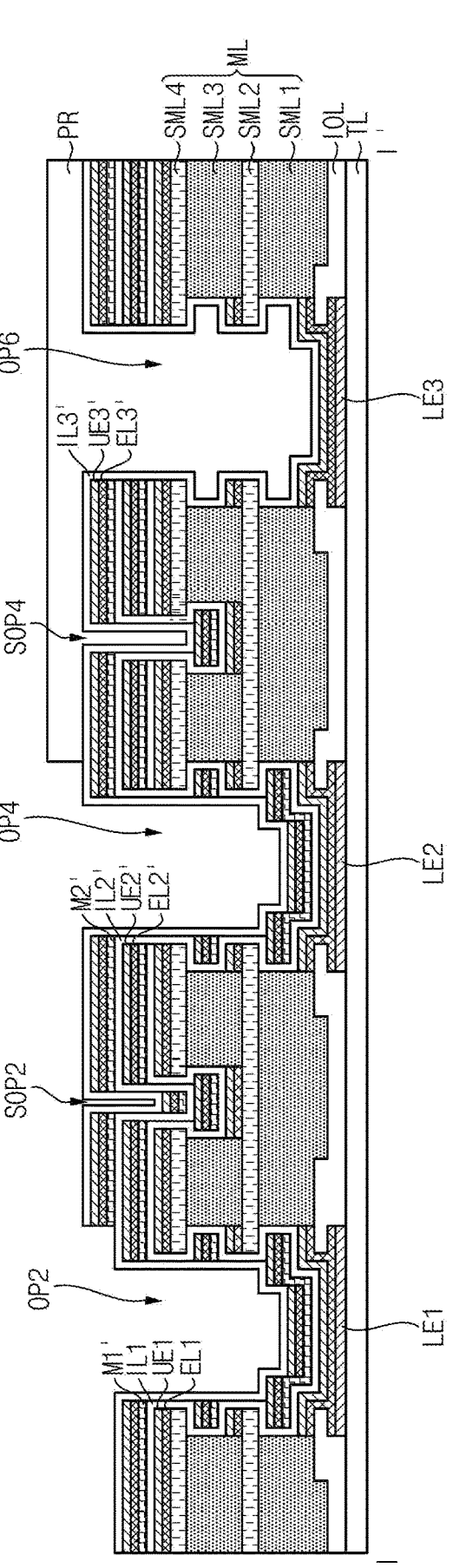

Referring to FIG. 39, a photoresist layer PR may be formed on the preliminary third insulating layer IL3'. The preliminary second insulating layer IL2' overlapping the first lower electrode LE1, and the third preliminary insulating layer IL3' overlapping the second lower electrode LE2 and the second sub-opening SOP2 may be exposed by patterning the photoresist layer PR.

Figure 40:
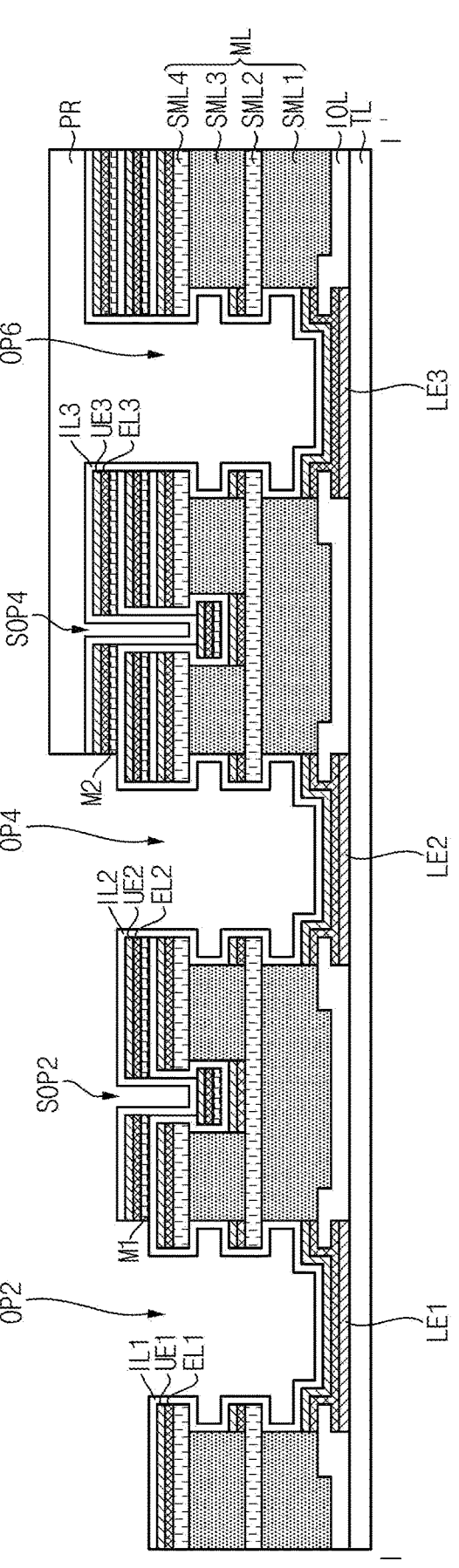

Referring to FIG. 40, the preliminary first protective layer M1', the preliminary second light emitting layer EL2', the preliminary second upper electrode UE2' and the preliminary second insulating layer IL2' respectively overlapping the first lower electrode LE1 may be removed. The preliminary second protective layer M2', the preliminary third light emitting layer EL3', the preliminary third upper electrode UE3' and the preliminary third insulating layer IL3' respectively overlapping the second lower electrode LE2 may be removed.

For example, in an embodiment the preliminary second light emitting layer EL2', the preliminary second upper electrode UE2', the preliminary second insulating layer IL2', the preliminary third light emitting layer EL3', the preliminary third upper electrode UE3' and the preliminary third insulating layer IL3' may be partially removed by a dry etching method, and the preliminary first protective layer M1' and the preliminary second protective layer M2' may be partially removed by a wet etching method.

In this embodiment, since the preliminary first protective layer M1' is disposed on the preliminary first insulating layer IL1', the preliminary first insulating layer IL1' may not be removed by the dry etching method. For example, the preliminary first protective layer M1' may protect the preliminary first insulating layer IL1' from being etched by the dry etching method.

In addition, the preliminary second protective layer M2' may protect the preliminary second insulating layer IL2' overlapping the second lower electrode LE2 and the second sub-opening SOP2 from being etched by the dry etching method.

In an embodiment, the first protective layer M1, the second light emitting layer EL2, the second upper electrode UE2, the second insulating layer IL2, the second protective layer M2, the third light emitting layer EL3, the third upper electrode UE3 and the third insulating layer IL3 may be respectively formed by partially removing the preliminary first protective layer M1', the preliminary second light emitting layer EL2', the preliminary second upper electrode UE2', the preliminary second insulating layer IL2', the preliminary second protective layer M2', the preliminary third light emitting layer EL3', the preliminary third upper electrode UE3' and the preliminary third insulating layer IL3'.

Figure 41:
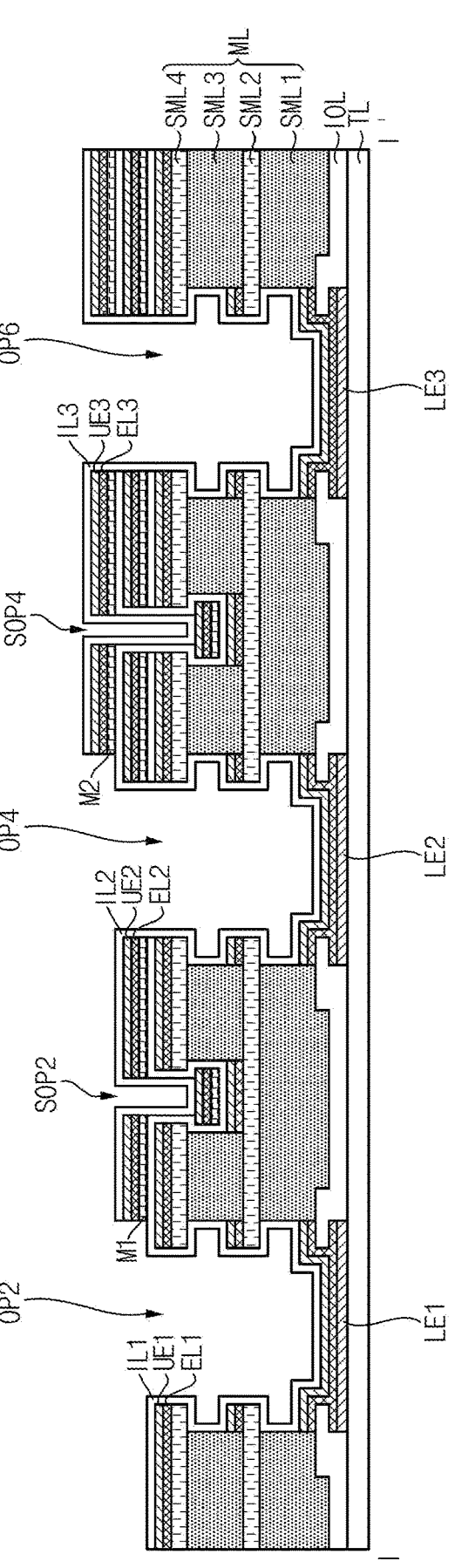

Referring to FIG. 41, the photoresist layer PR may be removed.

Figure 42:
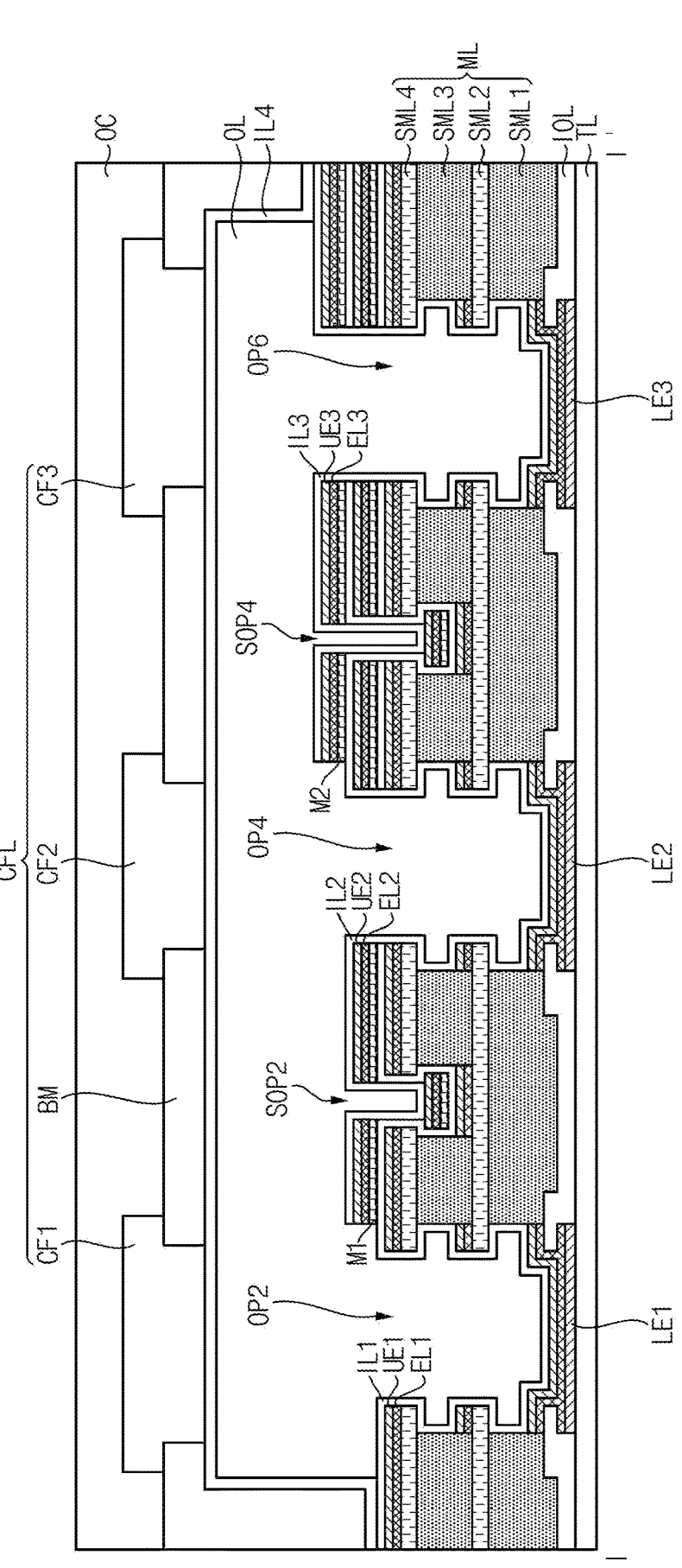

Referring to FIG. 42, the organic insulating layer OL and the fourth insulating layer IL4 may be formed on the first, second and third insulating layers IL1, IL2 and IL3. The first, second and third insulating layers IL1, IL2 and IL3, the organic insulating layer OL and the fourth insulating layer IL4 may constitute the thin film encapsulation layer. The color filter layer CFL and the overcooling layer OC may be formed on the fourth insulating layer IL4.

Figure 43:
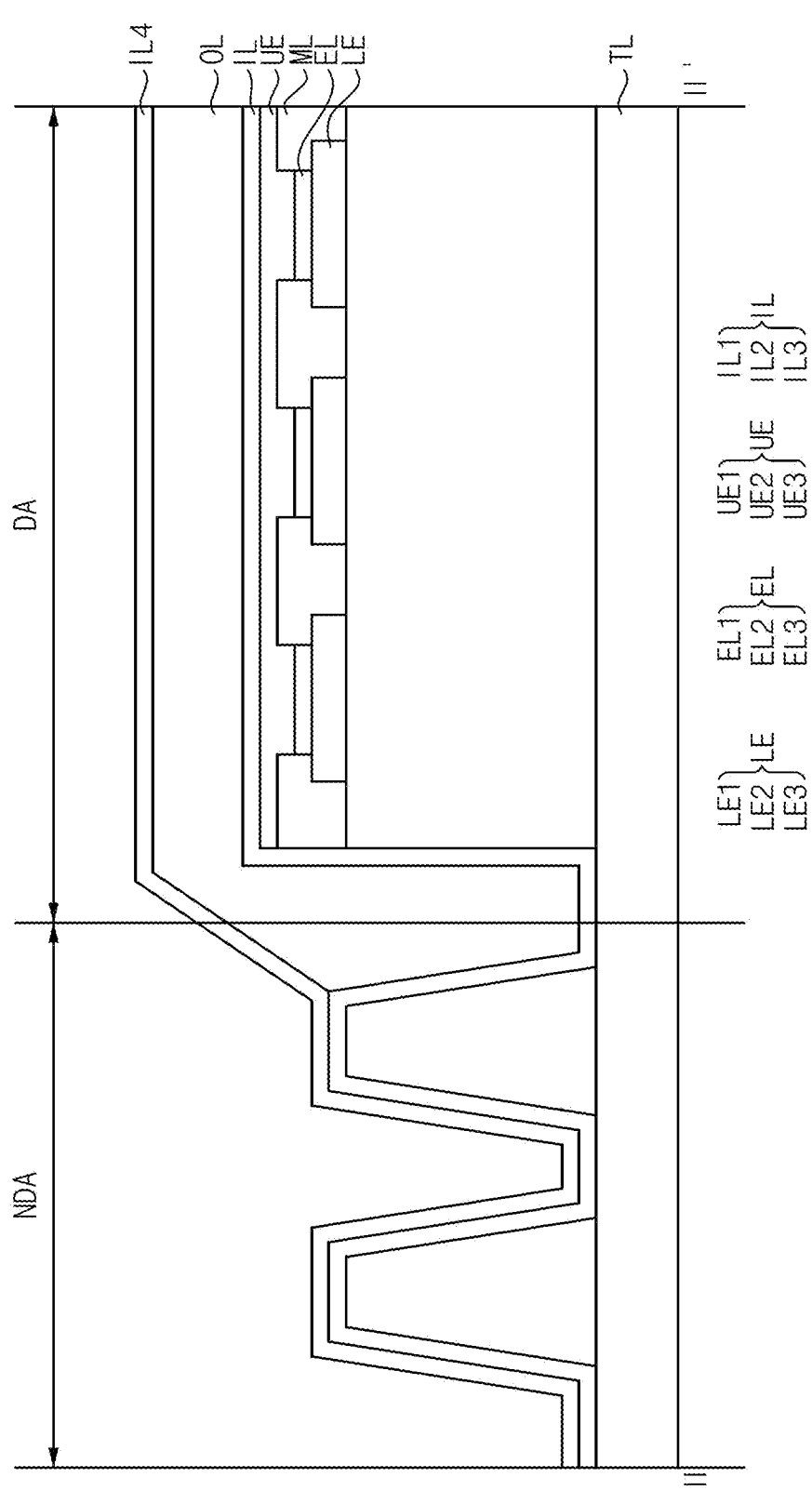
FIG. 43 is a cross-sectional view taken along line II-II' of FIG. 1 according to an embodiment of the present disclosure.

FIG. 43 is a cross-sectional view taken along line II-II' of FIG. 1.

A conventional display device according to a comparative embodiment includes a light emitting layer, and the light emitting layer is formed using a mask. For example, the mask may be a fine metal mask, and a dummy pixel that does not emit light is formed between a non-display area and a display area of the display device to secure a process margin by the mask. Due to this, there is a problem that the display area of the conventional display device is limited.

However, referring to FIG. 43, since the first, second and third light emitting layers EL1, EL2 and EL3 are formed without using a mask, a dummy pixel may not be formed between the non-display area NDA and the display area DA. Accordingly, the display area DA may be enlarged.

As the first, second and third light emitting layers EL1, EL2 and EL3, the first, second and third upper electrodes U1, UE2 and UE3 and the first, second and third insulating layers IL1, IL2 and IL3 are formed without using a mask, the quality and productivity of the display device 10 may be increased. In addition, the second sub-metal layer SML2 and the fourth sub-metal layer SML4 may be formed to protrude further from the first sub-metal layer SML1 and the third sub-metal layer SML3, and the second sub-opening SOP2 the fourth sub-opening SOP4 may be formed of the undercut structure. Accordingly, the peeling phenomenon of the first, second and third insulating layers IL1, IL2 and IL3 may be reduced.

Also, dummy pixel and shadow formed using the mask may not be formed in the display device 10. Accordingly, the display area DA of the display device 10 may be enlarged.

Figure 44:
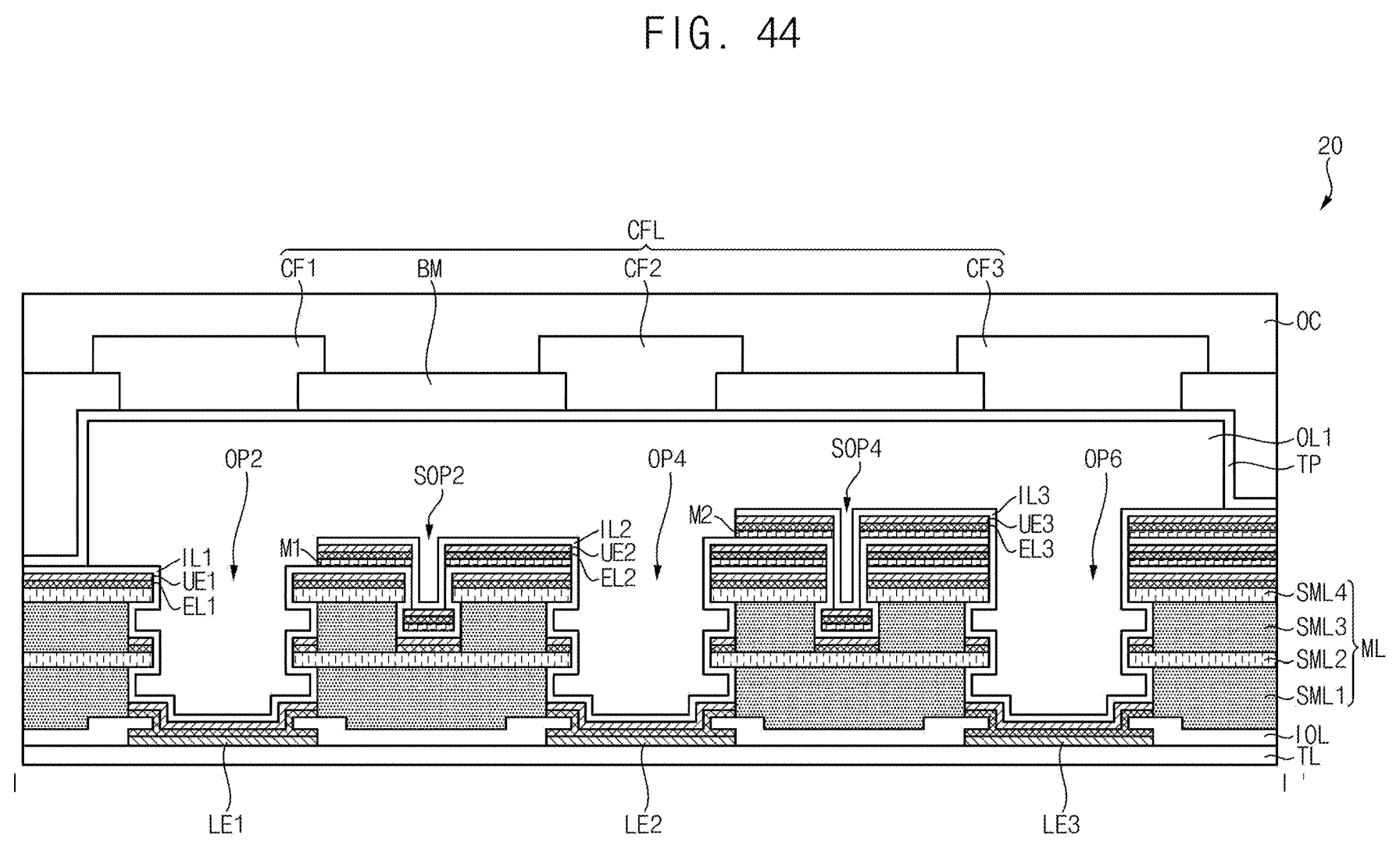

FIG. 44 is a cross-sectional view illustrating a display device according to an embodiment.

Referring to FIG. 44, a display device 20 according to an embodiment of the present disclosure may include a transistor layer TL, a lower electrode LE, an inorganic layer IOL, a metal layer ML, a first light emitting layer EL1, a first upper electrode UE1, a first insulating layer IL1, a first protective layer M1, a second light emitting layer EL2, a second upper electrode UE2, a second insulating layer IL2, a second protective layer M2, a third light emitting layer EL3, a third upper electrode UE3, a third insulating layer IL3, an organic layer OL1, a touch pattern layer TP, a color filter layer CFL and an overcoating layer OC.

However, the display device 20 may be substantially the same as the display device 10 described with reference to FIG. 2 except for the organic layer OL1 and the touch pattern layer TP.

The organic layer OL1 may be disposed on the first, second and third insulating layers IL1, IL2 and IL3. In an embodiment, the organic layer OL1 may be formed of an organic material. Examples of the organic material may include photoresist, polyacrylic resin, polyimide resin, acrylic resin, or the like. These materials may be used alone or in combination with each other. Accordingly, the organic layer OL1 may have a substantially flat upper surface.

The touch pattern layer TP may include a touch inorganic layer and touch electrodes. The touch inorganic layer may be disposed on the organic layer OL1, and the touch electrodes may be disposed on the touch insulating layer.

Embodiments of the present disclosure can be applied to various display devices. For example, embodiments of the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in embodiments without materially departing from the novel teachings and advantages of the present disclosure. Accordingly, all such modifications are intended to be included within the scope of the present disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present disclosure.

What is claimed is:

1. A display device comprising:
   a substrate;
   a lower electrode disposed on the substrate;
   a metal layer disposed on the substrate and exposing at least a portion of the lower electrode, the metal layer including a plurality of sub-metal layers;
   a light emitting layer disposed on the lower electrode and the metal layer, the light emitting layer directly contacting upper surfaces of some of the plurality of sub-metal layers;
   an upper electrode disposed on the light emitting layer; and
   an insulating layer disposed on the upper electrode.

2. The display device of claim 1, wherein the plurality of sub-metal layers includes:
   a first sub-metal layer;
   a second sub-metal layer disposed on the first sub-metal layer,
   a third sub-metal layer disposed on the second sub-metal layer; and
   a fourth sub-metal layer disposed on the third sub-metal layer.

3. The display device of claim 2, wherein the second sub-metal layer and the fourth sub-metal layer protrude from the first sub-metal layer and the third sub-metal layer in a direction parallel to an upper surface of the substrate.

4. The display device of claim 2, wherein:

the first sub-metal layer and the third sub-metal layer include aluminum; and the second sub-metal layer and the fourth sub-metal layer include titanium.

5. The display device of claim 2, wherein the upper electrode directly contacts the first sub-metal layer and the third sub-metal layer.

6. The display device of claim 2, wherein the metal layer has a sub-opening exposing at least a portion of the second sub-metal layer.

7. The display device of claim 6, wherein the sub-opening has an undercut structure.

8. The display device of claim 1, wherein the insulating layer covers the light emitting layer, the upper electrode and the metal layer.

9. An electronic device, comprising:

a display device comprising:

a substrate;

a lower electrode disposed on the substrate;

a metal layer disposed on the substrate and exposing at least a portion of the lower electrode, the metal layer including a plurality of sub-metal layers;

a light emitting layer disposed on the lower electrode and the metal layer, the light emitting layer directly contacting upper surfaces of some of the plurality of sub-metal layers;

an upper electrode disposed on the light emitting layer; and an insulating layer disposed on the upper electrode.

* * * * *